(12) United States Patent
Saeki

(10) Patent No.: US 6,847,243 B2
(45) Date of Patent: Jan. 25, 2005

(54) CLOCK CONTROLLING METHOD AND CIRCUIT

(75) Inventor: Takanori Saeki, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/851,891

(22) Filed: May 21, 2004

(65) Prior Publication Data

US 2004/0212411 A1 Oct. 28, 2004

Related U.S. Application Data

(62) Division of application No. 09/910,117, filed on Jul. 20, 2001, now Pat. No. 6,791,385.

(30) Foreign Application Priority Data

Jul. 21, 2000 (JP) ........................ 2000-221207

(51) Int. Cl.[7] ................................ H03L 7/00
(52) U.S. Cl. ....................... 327/163; 327/156
(58) Field of Search ............... 327/163, 156, 327/147, 162, 154, 150; 375/375, 376; 382/236, 234; 704/205

(56) References Cited

U.S. PATENT DOCUMENTS

| | | | | |
|---|---|---|---|---|
| 3,921,079 A | | 11/1975 | Heffner et al. | 328/62 |
| 5,191,545 A | * | 3/1993 | Sevenhans et al. | 708/290 |
| 5,258,724 A | * | 11/1993 | Tanis et al. | 327/105 |
| 5,801,589 A | | 9/1998 | Tajima et al. | 331/1 |
| 5,841,707 A | * | 11/1998 | Cline et al. | 327/276 |
| 6,005,445 A | | 12/1999 | Katakura | 331/34 |
| 6,014,065 A | * | 1/2000 | Nishikawa | 332/103 |
| 6,052,004 A | | 4/2000 | Saeki | 327/116 |
| 6,081,484 A | * | 6/2000 | West | 368/120 |
| 6,157,604 A | * | 12/2000 | Feyh et al. | 369/59.21 |
| 6,194,932 B1 | * | 2/2001 | Takemae et al. | 327/158 |
| 6,259,290 B1 | * | 7/2001 | Takada et al. | 327/158 |
| 6,259,295 B1 | * | 7/2001 | Kriz et al. | 327/149 |
| 6,323,705 B1 | * | 11/2001 | Shieh et al. | 327/158 |
| 6,337,589 B1 | | 1/2002 | Ooishi | 327/156 |

FOREIGN PATENT DOCUMENTS

| | | | |
|---|---|---|---|
| CN | 1169622 A | 1/1998 | |
| CN | 1213225 A | 4/1999 | |
| JP | 03-145315 | 6/1991 | ............ H03H/7/20 |
| JP | 04-057408 | 2/1992 | ............ H03K/5/13 |
| JP | 08-008741 | 1/1996 | ............ H03L/7/183 |
| JP | 08-288806 | 11/1996 | ............ H03K/5/13 |
| JP | 09-064858 | 3/1997 | ............ H04L/7/02 |
| JP | 09-261212 | 3/1997 | .......... H04L/7/033 |
| JP | 09-186564 | 7/1997 | ............ H03K/5/13 |
| JP | 10-126263 | 5/1998 | ............ H03L/7/183 |
| JP | 10-215241 | 8/1998 | ............ H04L/7/02 |
| JP | 11-032358 | 2/1999 | ............ H04Q/3/72 |
| JP | 11-218564 | 8/1999 | ........ G01R/31/3183 |
| JP | 11-266155 | 9/1999 | ............ H03L/7/197 |
| JP | 11-284497 | 10/1999 | .......... H03K/5/135 |
| TW | 347613 | 11/1998 | ............ H03K/7/08 |

* cited by examiner

*Primary Examiner*—Linh My Nguyen
(74) *Attorney, Agent, or Firm*—Hayes Soloway P.C.

(57) ABSTRACT

A clock control circuit comprises a control circuit 102 for outputting a control signal for adding or subtracting a phase to a reference clock, which is an input clock or a clock generated from the input clock, on each clock period of the reference clock, and a phase adjustment circuit 101 fed with the input clock and outputting an output clock having the phase adjusted to the reference clock.

1 Claim, 27 Drawing Sheets

PULSE WIDTH CORRECTION CIRCUIT

MULTIPLEXING CIRCUIT

4a1; TIMING DIFFERENCE DIVISION CIRCUIT

4a2; TIMING DIFFERENCE DIVISION CIRCUIT

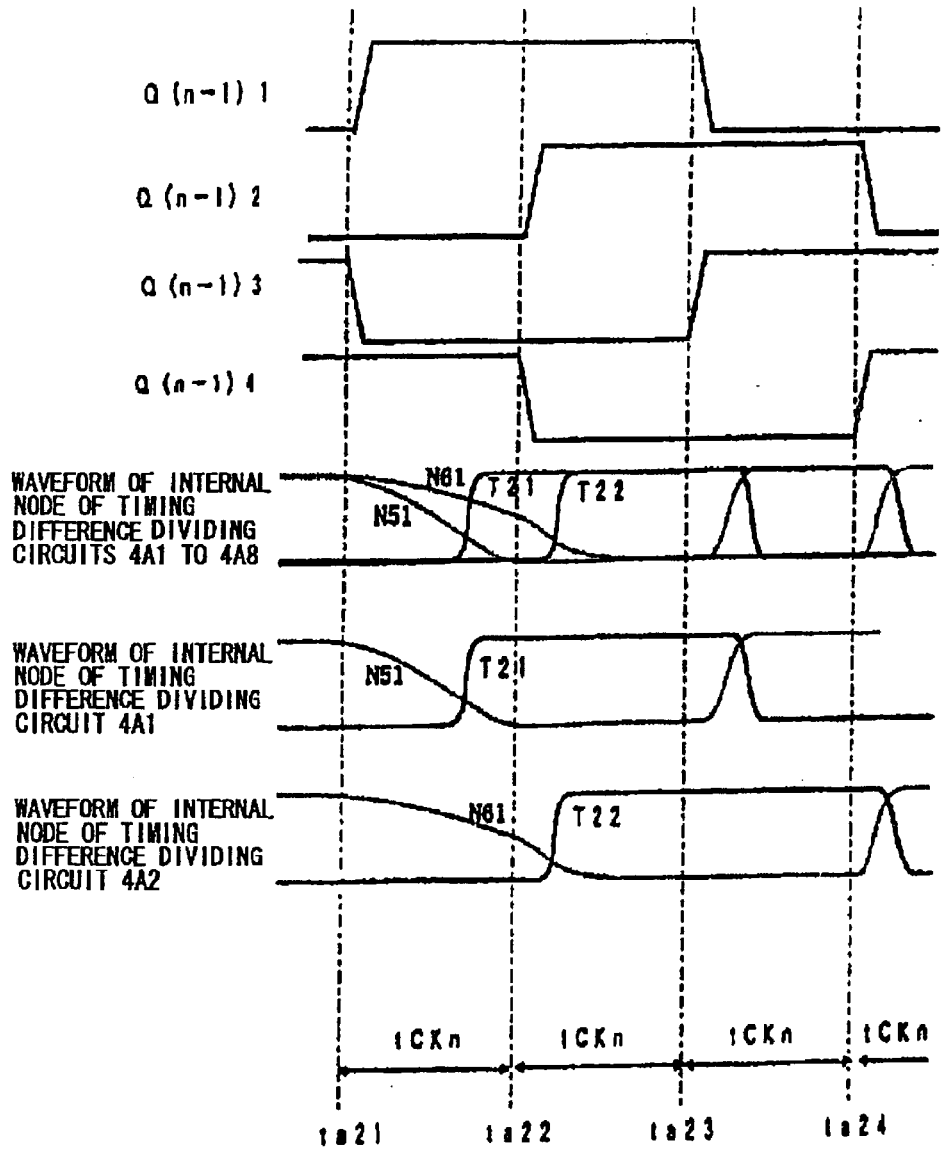

FIG. 11 a
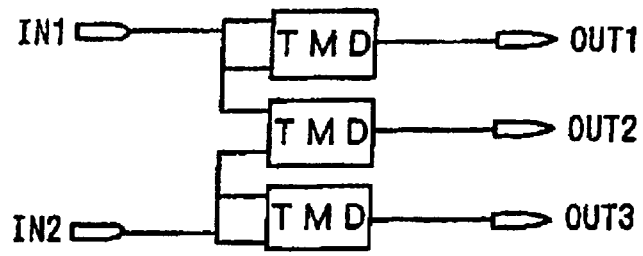
FIG. 11 b
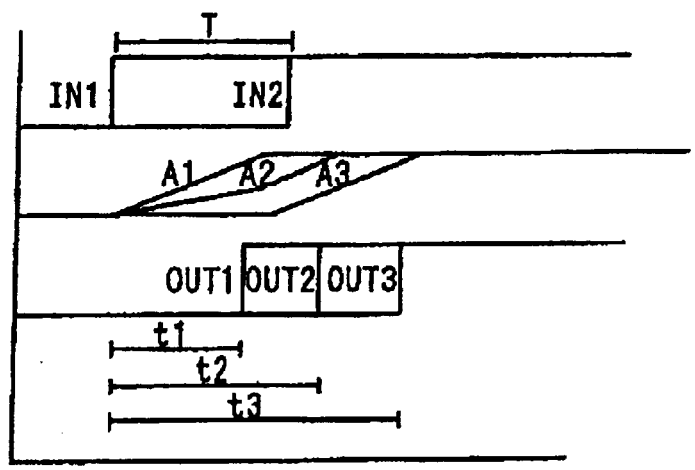
FIG. 11 c
$t1 = CV/2I$
$t2 = T + (CV - IT)/2I$
$t2 = (1/2)T + t1$
$t3 = T + CV/2I = T + t1$

CLOCK CONTROLLING METHOD AND CIRCUIT

CROSS-REFERENCE TO RELATED APPLICATION

This application is a divisional of U.S. application Ser. No. 09/910,117, filed Jul. 20, 2001 now U.S. Pat. No. 6,791,385.

FIELD OF THE INVENTION

This invention relates to a clock control circuit and a clock control method.

BACKGROUND OF THE INVENTION

A PLL (phase locked loop) circuit is used in a circuit for adjusting a clock period. FIG. 27 illustrates a conventional PLL circuit. Referring to FIG. 27, a phase frequency detector. (PFD) 319 receives an external clock 324 and a signal supplied from a frequency divider 323 that receives an output of a voltage-controlled oscillator 322. A charge pump 320 receives a up signal 325 and a down signal 326 both output from a phase frequency detector (PFD) 319 to output a voltage corresponding to a phase difference. A loop filter receives the voltage from the charging pump 320 to output smoothed voltage which is supplied as a control voltage to the voltage-controlled oscillator (VCO) 322. An output clock signal of a frequency corresponding to the control voltage from the voltage-controlled oscillator (VCO) 322 is fed to a frequency divider 323.

For example, there is proposed in JP Patent Kokai JP-A-11-284497 a programmable delay generator in which a ramp waveform voltage for determining a delay time and a threshold voltage can be generated by circuits of the same structure and can be independently set so that it is capable of generating the delay time of a fractional number, a numerator and a denominator of which can be set, a frequency synthesizer which, by phase-interpolating output pulses of an accumulator using a programmable delay generator, is able to generate an adjustment-free low-spurious output signal, a multiplication circuit employing a programmable delay generator, a duty ratio converter circuit employing the programmable delay generator as an output pulse width setting delay generator, and a PLL frequency synthesizer having the programmable delay generator inserted between the frequency divider and a phase comparator.

SUMMARY OF THE DISCLOSURE

However, the conventional circuit, as shown in FIG. 27, employing a PLL circuit and a feedback type circuit, has drawbacks that phase adjustment operation is time-consuming and that there exists a jitter (phase noise) proper to a feedback system.

Moreover, the above-described conventional programmable delay generator is in need of a power source voltage generating circuit, such as a threshold voltage generating circuit, and hence the circuit scale is increased.

It is therefore an object of the present invention to provide a clock control circuit and a clock control method whereby non-integer frequency conversion can be effected with a high degree of accuracy by a simplified configuration.

For accomplishing the above object, one aspect of the present invention is a configuration in which a clock is input and an output clock having a phase difference relative to the input clock, the phase obtained by adding or subtracting to or from said phase by a predetermined unit value of a phase differential, on each constant period, is output.

In accordance with another aspect of the present invention, a clock control circuit comprises control means for outputting a control signal for adding or subtracting to or from the phase of an output signal relative to a reference clock, which is an input clock or a clock generated from the input clock, on each clock period of the reference clock, and phase adjustment means fed with the input clock for generating and outputting output clock having a phase corresponding to adding or subtracting a preset unit value of a phase differential to or from a phase with respect to the reference clock, based on the control signal, whereby an output clock of a frequency in a non-integer relation to the frequency of the reference clocks can be output.

Another aspect of the present invention is a clock control circuit comprising a frequency divider for outputting frequency-divided clock obtained on frequency dividing the input clock, a control circuit for generating a control signal for adding or subtracting a unit phase difference to or from the input clock with respect to the frequency-divided clock based on the frequency divided clock output from the frequency divider and a phase adjustment circuit fed with the input clock and generating and outputting an output clock having a phase prescribed by the control signal from the control circuit.

Another aspect of the present invention is a clock control circuit comprising a multi-phase clock generating circuit for generating and outputting first to nth clocks having respective different phases (multi-phase clocks) from a phase of the input clock, a selector fed with the first to nth clocks to selectively output one of the clocks, and a control circuit fed with the input clock to generate a control signal sequentially selecting the first to nth clocks to send the generated selection signal to the selector.

Another aspect of the present invention is a clock control circuit comprising an interpolator receiving a frequency divided signal produced by a frequency dividing circuit receiving a clock signal and a signal obtained by shifting the frequency divided signal in a preset number of periods of the clock to produce a signal obtained on division of a timing difference of said two input signals at a preset ratio of internal division; and a control circuit for varying the value of the ratio of the internal division of the timing difference in said interpolator based on said clock signals.

Another aspect of the present invention is a clock control circuit comprising a plurality of (N) interpolators for outputting signals obtained on dividing a timing difference of two input signals with respective different values of a preset ratio of internal division; wherein of first to nth clocks with respective different phases, two clocks, that is the Ith and the (I+1)St clocks, where I is an integer from 1 to N, with N+1 being 1, are input to the Ith interpolator.

In accordance with another aspect of the present invention, the interpolator comprises a logic circuit fed with first and second input signals to output a result of preset logical processing of said first and second input signals;

a first switching device connected across a first power source and an internal node, said first switching device being fed at a control terminal thereof with an output signal of said logic circuit and being turned on when said first and second input signals are both of a first value;

a buffer circuit having an input terminal connected to said internal node and having an output logical value changed on inversion of relative magnitudes of the terminal voltage of the capacitance of said internal node and a threshold value;

a plurality of serial circuits connected across said internal node and a second power source in parallel, each of said serial circuits being made up of a second switching device turned on when said first input signal is of a second value, said third switch device turned on or off based on a control signal from said control circuit, and a first constant current source; and a plurality of serial circuits connected across said internal node and a second power source in parallel, each of said serial circuits being made up of a fourth switching device turned on in common when said first input signal is of a second value, said fifth switching device turned on or off based on a control signal from said control circuit, and a constant current source.

In accordance with another aspect of the present invention, said interpolator comprises a logic circuit receiving first and second input signals to output results of preset logical processing of said first and second input signals;

a first switching device connected across a first power source and an internal node, said first switching device being fed at a control terminal thereof with an output signal of said logic circuit and being turned on when said first and second input signals are both of a first value; and a buffer circuit having an input end connected to said internal node and having an output logical value changed on inversion of the relative magnitudes of the terminal voltage of the capacitance of said internal node and a threshold value;

a plurality of serial circuits connected across said internal node and a second power source in parallel, each of said serial circuits being made up of a second switching device turned on when said first input signal is of a second value, said third switch device turned on or off based on a control signal from said control circuit, and a first constant current source;

a plurality of serial circuits connected across said internal node and a second power source in parallel, each of said serial circuits being made up of a fourth switching device turned on in common when said first input signal is of a second value, said fifth switching device turned on or off based on a control signal from said control circuit, and a constant current source; and a plurality of serial circuits connected across said internal node and the second power source in parallel, each said serial circuit being made up of a sixth switching device and a capacitor device; the value of said capacitance attached to said internal node being determined by a period control signal supplied to a control terminal of said sixth switching device.

In accordance with another aspect of the present invention, a clock control method comprises the steps of generating an output clock having a phase relative to a reference clock by adding or subtracting to or from said phase by a predetermined unit value of a phase differential on each clock period of said reference clock, said reference clock being an input clock or a clock derived from the input clock; and outputting said output clock.

Still other objects and advantages of the present invention will become readily apparent to those skilled in this art from the following detailed description, wherein only the preferred embodiment of the invention is shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 9 is a timing diagram for illustrating the operation of a timing difference division circuit (interpolator) of FIG. 6.

FIG. 11 illustrates an operating principle of the timing difference division circuit (interpolator).

PREFERRED EMBODIMENTS OF THE INVENTION

Figure 1:
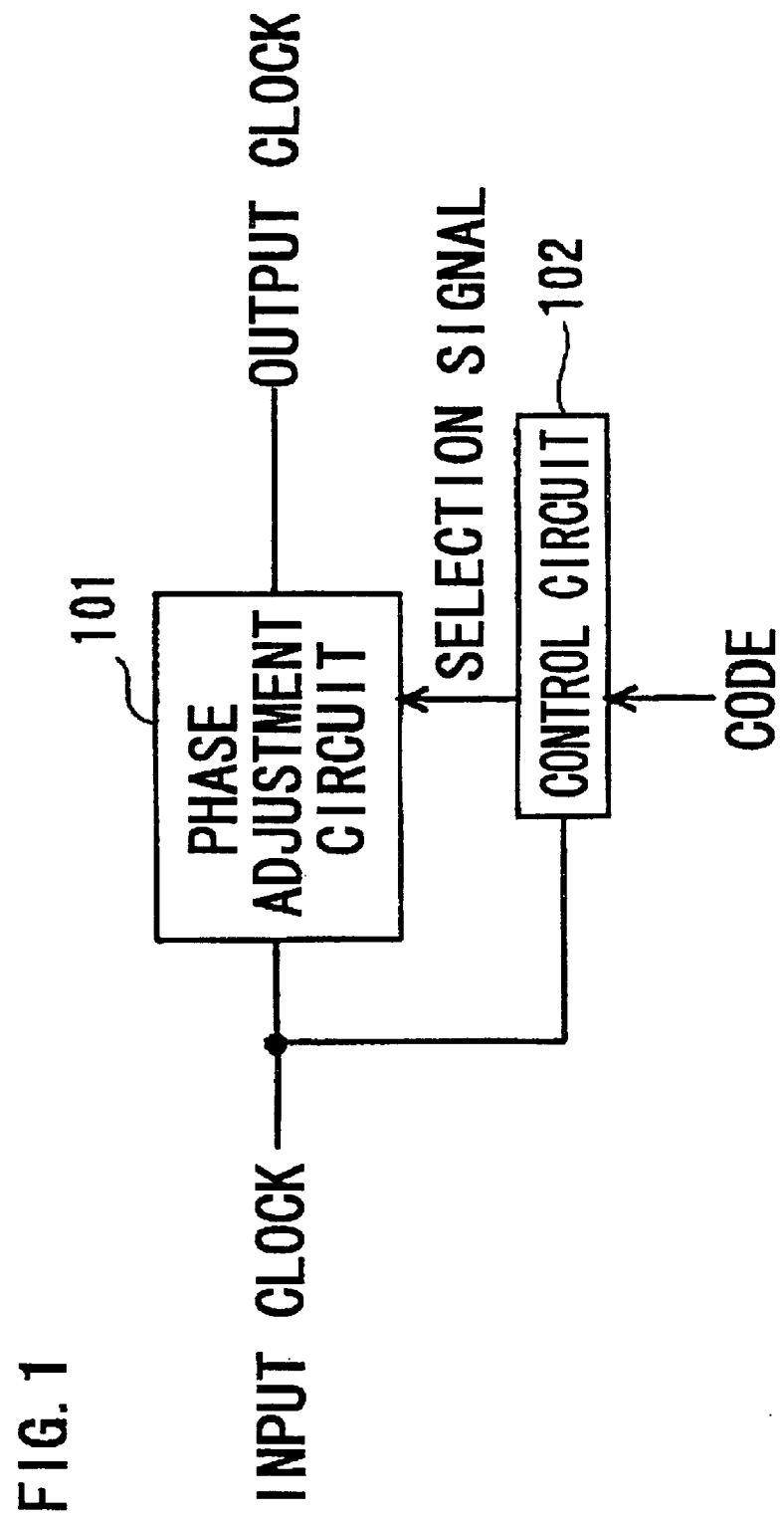
FIG. 1 shows a configuration of a first embodiment of the present invention.

Preferred embodiments of the present invention are described below. In a preferred embodiment of the present invention, a clock control circuit comprises a control circuit (102 of FIG. 1) for outputting a selection control signal for selecting incrementing (adding) or decrementing (subtracting) to or from a phase relative to a reference clock by a predetermined unit value of a phase differential on each reference clock cycle, which is an input clock or a clock generated from an input clock; and a phase adjustment circuit (101 of FIG. 1) fed with the input clock and generating an output clock having a phase corresponding to incrementing or decrementing a predetermined unit phase value of a phase differential with respect to the reference clock, based on the control signal, whereby an output clock of a frequency in a non-integer relation with respect to the frequency of the reference clock can be output.

In another preferred embodiment of the present invention, a clock comprises a frequency divider (103 of FIG. 3) for outputting frequency-divided clocks obtained by frequency dividing the input clock, a control circuit (102 of FIG. 3) for generating a control signal for adding or subtracting to or from a phase by a unit phase differential relative to the input clock with respect to the frequency-divided clocks based on the frequency divided clocks' output from the frequency divider, and a phase adjustment circuit (101 of FIG. 3) fed with the input clock and generating and outputting an output clock having a phase prescribed by the control signal from the control circuit.

In another preferred embodiment of the present invention, a clock control circuit comprises a multi-phase clock generating circuit (201 of FIG. 4) for generating and outputting first to nth clocks having respective difference phases from the phase of the input clock (multi-phase clocks), and a selector (203 of FIG. 4) fed with the first to nth clocks to selectively output one of the clocks and a control circuit (202 of FIG. 4) fed with the input clock to generate a control signal sequentially selecting the first to nth clocks to send the generated selection signal to the selector.

According to the present invention, the phase adjustment circuit is comprises an interpolator for dividing timing difference of two input signals to output a signal. There is provided a control circuit operating so that a signal obtained on frequency division of the clock signals and a signal shifted preset clock periods are input to the interpolator and the timing difference division ratio in the interpolator is changed based on the clock signals.

Alternatively, there may be provided plural interpolators, each of which outputs a signal, a propagation delay of said signal corresponding to the division of timing difference between two input signals. The values of timing difference division ratio in the plural interpolators are set to respective different values. Plural sets of two clocks of plural (N) clocks of different phase may be input to the plural interpolators so that both end side clocks, that is the first and Nth clocks are provided to olic interpolator.

In another preferred embodiment of the present invention, a clock control circuit comprises a multi-phase multiplication clock generating circuit (10 of FIG. 20) for generating first to nth clocks, phases of which are different (termed multi-phase multiplication clocks) obtained on multiplying input clock based on the input clock, a switch (20 of FIG. 20) for selecting two of the first to nth clocks output from the multi-phase multiplication clock generating circuit, an interpolator (30 of FIG. 20) fed with the two clock signals selected and output by the switch to output a signal corresponding to division of the two clock signals, with a ratio of the internal division being variably set, and a control circuit (40 of FIG. 20) for outputting a switching signal for the switch and a control signal for variably setting the ratio of the internal division of the timing difference of the interpolator.

In another preferred embodiment of the present invention, a clock control circuit comprises a multi-phase multiplication clock generating circuit (10 of FIG. 22) for generating first to nth clocks of respective different phases(multi-phase multiplication clocks) obtained on multiplying frequency divided input clock based on the input clock, a switch (20 of FIG. 22) for selecting two sets each of two neighboring ones of the first to nth clocks output from the multi-phase multiplication clock generating circuit, a first interpolator ($30_1$ of FIG. 22) fed with the first set of two clocks output from the switch to output a signal, a propagation delay of said signal corresponding to division of the timing difference of the two clock signals, a second interpolator ($30_2$ of FIG. 22) fed with the second set of two clocks output from the switch to output a signal, a propagation delay of said signal corresponding to division of the timing difference of the two clock signals, a third interpolator ($30_3$ of FIG. 22) fed with outputs of the first and second interpolators to output a signal, a propagation delay of said signal corresponding to division of the timing difference of the two outputs, and a control circuit (40 of FIG. 22) for outputting a switching signal for the switch and a control signal for variably setting ratio of the internal division of the timing difference of the interpolators. The ratio of the internal division of the timing difference of at least one of the first to third interpolators can be set variably.

The multi-phase multiplication circuit comprises a frequency divider (2 of FIG. 5) for frequency dividing an input clock to generate and output a plurality of clocks of different phases (multi-phase clocks), a period detection circuit (6 of FIG. 5) for detecting a period of the input clock and a multi-phase clock multiplication circuit (5 of FIG. 5) fed with the multi-phase clocks corresponding to frequency multiplied clocks toe generate multi-phase clocks corresponding to multiplication of the clock.

The multi-phase clock multiplication circuit preferably comprises a plurality of timing difference division circuits (4a1 to 4a8 of FIG. 6) for outputting a signal corresponding to the division of the timing difference of two inputs and a plurality of multiplexing circuits (4b1 to 4b4 of FIG. 6) multiplexing two outputs of the timing difference division circuits to output the resulting multiplexed signals.

The timing difference division circuit include timing difference division circuits (4a1, 4a3, 4a5, 4a7 of FIG. 6) fed with clocks of the saner phase and timing difference division circuits (4a2, 4a4, 4a6, 4a8 of FIG. 6) fed with two clocks of neighboring phases.

The multi-phase clock multiplication circuits (5) preferably comprises 2n timing difference division circuits for outputting signals corresponding to division of the timing difference of two inputs, wherein (2I−1)st timing difference division circuits (4a1 to 4a8 of FIG. 6), where 1≦I≦n, are fed with the same Ith clocks as the two inputs, 2Ith timing difference division circuits (4a2, 4a4, 4a6, 4a8 of FIG. 6), where 1≦I≦n, are fed with the Ith clocks and with the (I+1 mod n)th clocks, where mod denotes remainder calculations and I+1 mod n means the remainder of the division of (I+1) with m, 2n pulse width correction circuits (4c1 to 4c8 of FIG. 6) fed with outputs of Jth timing difference division circuits, where 1≦J≦2n, and with outputs of (J+2 mod n)th timing difference division circuits, where J+2 mod n means the remainder of division of J+2 with n, and n multiplexing circuits (4b1 to 4b4 of FIG. 6) fed with outputs of Kth pulse width correction circuit, where 1≦K≦n, and with outputs of the (K+n)th pulse width correction circuits.

In another preferred embodiment of the present invention, a clock control circuit comprises a frequency divider (60 of FIG. 23) fed with input clock to generate two sets of clocks of respective different phases obtained on frequency division of the input clock, a first interpolator ($30_1$ of FIG. 23) fed with the first set of two clocks output from the frequency divider to output a signal, a propagation delay of said output signal corresponding to division of timing difference of the two clock signals, a second interpolator ($30_2$ of FIG. 23) fed with the second set of two clocks output from the frequency divider to output a signal, a propagation delay of said output signal corresponding to division of timing difference of the two clock signals, a third interpolator ($30_3$ of FIG. 23) fed with outputs of the first and second interpolators to output a signal, a propagation delay of said output signal corresponding to division of timing difference of the two outputs, with the ratio of the internal division of the timing difference of at least one of the first to third interpolators being variably set, and a control circuit (40 of FIG. 23) for outputting a switching signal for the switch and a control signal for variably setting the ratio of the internal division of the timing difference of the interpolators.

In another preferred embodiment of the present invention, a clock control circuit comprises a multi-phase multiplication clock generating circuit (10 of FIG. 24) for generating plural clocks of respective different phases obtained on frequency multiplying input clock based on the input clock, a plurality of interpolators ($30_1$ to $30_n$ of FIG. 24) fed with two clocks of neighboring phases of the plural clocks output from the multi-phase multiplication clock generating circuit to output signals, propagation delay of said signals corresponding to division with respective different values of ratio of internal division of timing difference of the two clocks and a synthesis unit (50 of FIG. 24) fed with outputs of the plural interpolators to multiplex the outputs of the interpolators to output a resulting sole output signal.

In this embodiment, the multi-phase multiplication clock generating circuit generates N phase clocks, where N is a preset positive integer, M of the interpolators are provided, where M is a positive integer such that M≦N.

The ith interpolator is fed with ith and (i+1)st clocks, where i is an integer from 1 to M while the (n+1)st clock is treated as a first clock. A value of ratio of internal division dividing timing difference of two input signals in each of the interpolators is so set that the ratio value of the (i+1)st interpolator is larger or smaller than that of the ith interpolator by a preset unit step.

M-phase clocks are output from the M interpolators and wherein M-tupled clocks are output from the synthesis unit. The internal division ratio dividing the timing different of the two interpolators is of a fixed value.

In the above-described embodiment of the present invention, shown in FIGS. 12 to 15, the interpolator comprises a logic circuit (NAND01) fed with first and second input signals to output results of preset logical processing of the first and second input signals, a first switching device (MP1) connected across a first power source and an internal node (N31), the first switching device being fed at a control terminal thereof with an output signal of the logic circuit and being turned on when the first and second input signals are both of a first value, a buffer circuit (INV3) having an input end connected to the internal node and having an output logical value changed on inversion of the relative magnitudes of the terminal voltage of the capacitance of the internal node and a threshold value, a plurality of serial circuits connected across the internal node and a second power source in parallel, each of the serial circuits being made up of a second switching device (MN11) turned on when the first input signal (IN1) is of a second value, the third switch device (MN21) turned on or off based on a control signal (PH) from the control circuit (40 of FIG. 20), and a constant current source ($I_o$), a plurality of serial(series) circuits connected across the internal node and a second power source in parallel, each of the serial circuits being made up of a fourth switching device (MN12) turned on in common when the first input signal is of a second value, the fifth switching device (MN22) turned on or off based on a control signal from the control circuit, and a constant current source ($I_o$).

The third switching device (MN21) may be connected on the side of the internal node (N31), with the second switching device (MN11) then being connected to the side of the constant current source ($I_o$) in an interchanging fashion. The fourth switching device (MNl2) may, of course, be interchanged with the fifth switching device (MN22).

A plurality of serial circuits, each made up of a sixth switching device and a capacitor (MN31 to MN34 and CAP11 to CAP14), are connected in parallel across the internal node (N31) and the second power source. The value of capacitance to be attached to the internal node is selectively determined by the periodic control signal 7 supplied to the control terminal of the group of the sixth switching devices (MN31 to MN34).

For more detailed explanation of a preferred embodiment of the present invention, certain preferred embodiments of the present invention will be explained with reference to the drawings.

FIG. 1 illustrates a structure of a first embodiment of the present invention. Referring to FIG. 1, the first embodiment of the present invention comprises a phase adjustment circuit 101 that receives an input clock and generate an output clock having a phase adjusted with respect to a reference clock as which is used the input clock or a signal derived from the input clock and a control circuit 102 that receives the input clock and the code information to output a selection signal to the phase adjustment circuit 101.

Preferably, the phase adjustment circuit 101 comprises an interpolator in which a interior division ratio of timing difference is variably set in a programmable way.

The control circuit 102 comprises an addition circuit for incrementing a preset unit m (m=1, 2, 3, . . . ) from an initial value 0 (0, m, 2m, 3m, . . . ) each time it is fed with the input clock. The preset value m is set by a code signal input to the control circuit 102 from outside.

The control circuit 102 may comprises a subtraction circuit for decrementing a preset unit m (m=1, 2, 3, . . . ) e.g., from the initial value N each time it is fed with an input clock. A result of the subtraction is decoded and a selection signal (control signal) corresponding to the result of the subtraction is supplied to the phase adjustment circuit 101. The value of the preset unit m is set by a code signal input from outside to the control circuit 102.

Based on the selection signal from the control circuit 102, the phase adjustment circuit 101 outputs a signal comprising pulse edges with phase differences of 0, ΔΦ, 2 ΔΦ, 3 ΔΦ, . . . , (n−1)ΔΦ, n ΔΦ, . . . , from corresponding edges, such as rising edges of an input clock with a period tCK, where ΔΦ is a unit phase differential which is determined by the selection signal from the control circuit 102. It is noted that n ΔΦ is equivalent to phase difference 0.

With the unit phase difference ΔΦ, for the selection signal "m" from the control circuit 102 being "1", the unit phase difference in the phase adjustment circuit 101 is m ΔΦ, such that signal with phase differences of 0, m ΔΦ, 2m ΔΦ, 3m ΔΦ, . . . , (n−1)m ΔΦ, nm ΔΦ, . . . is output from one input clock to another. It is noted that, with the unit phase difference ΔΦ of tCK/n, nm ΔΦ is equivalent to the phase difference 0.

Figure 2:
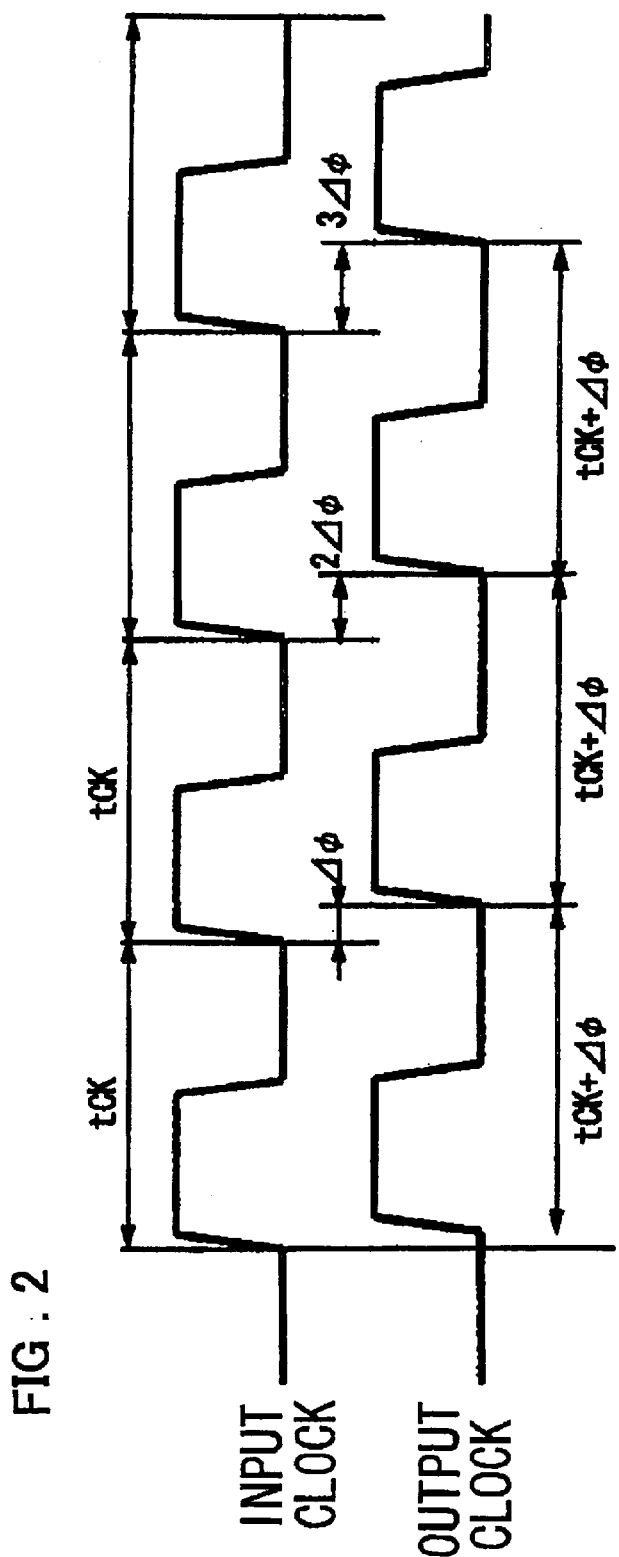
FIG. 2 is a timing chart for illustrating operation of the first embodiment of the present invention.

Referring to FIG. 2, showing the operating principle of the first embodiment of the present invention, a phase difference of an output clock relative to a rising edge of an input clock in a clock cycle 1 is 0, a phase difference of the output clock relative to a rising edge of the input clock in a clock cycle 2 is ΔΦ and a phase difference of the output clock relative to a rising edge of the input clock in a clock cyclic 3 is 2 ΔΦ, and so on.

A period of the output clock is tCK+ΔΦ, such that a frequency f=1/tCK of the input clock having a clock period tCK is frequency-converted into a frequency=1/(tCK+ΔΦ). A clock period is frequency-converted with a value other than integer ratio(non-integer value) (=1+ΔΦ/tCK) of the input clock frequency.

Figure 3:
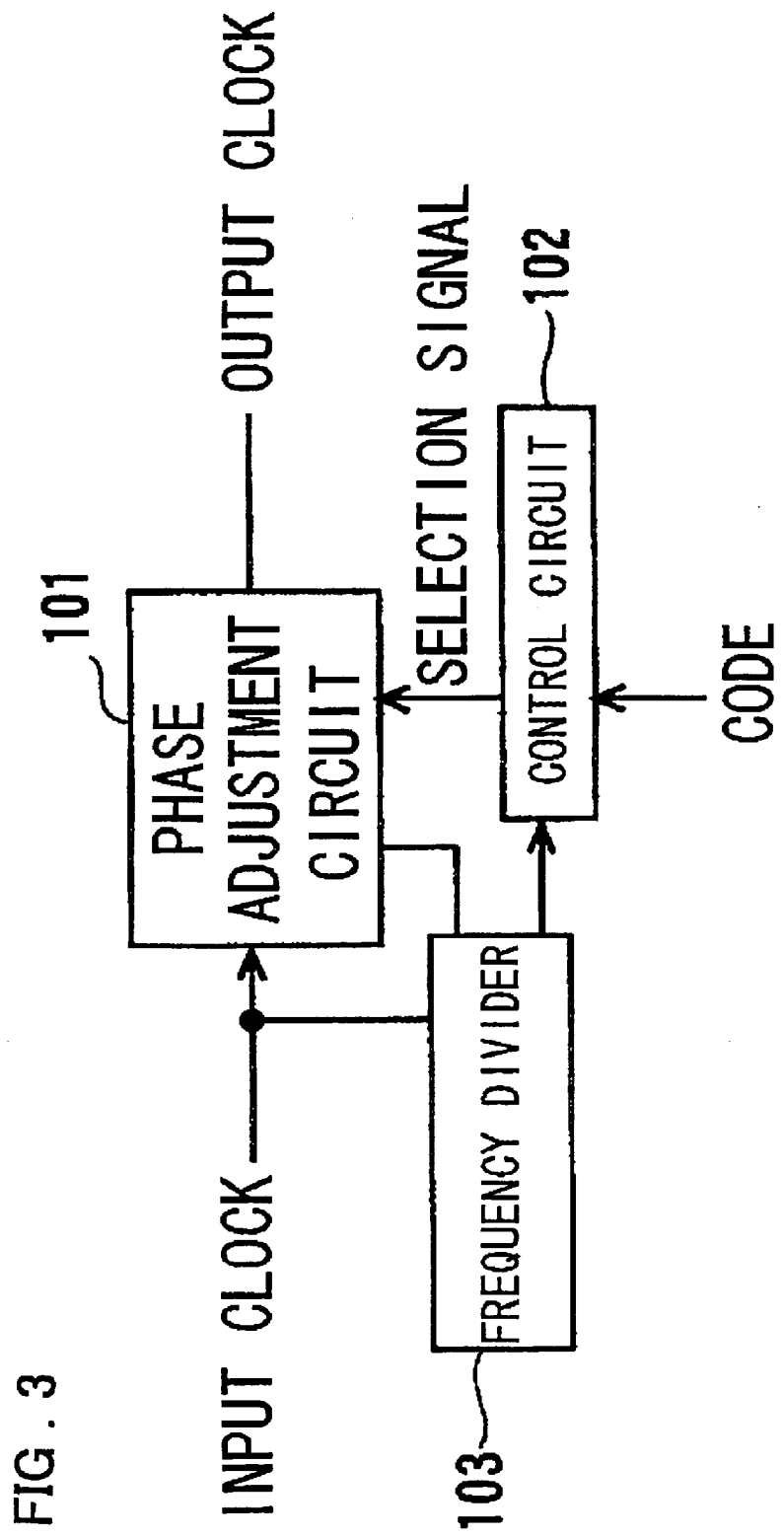
FIG. 3 shows a configuration of a second embodiment of the present invention.

When the output clock and the input clock are interchanged in FIG. 2, the result is the timing operation of the control circuit 102 made up of a subtraction unit and a decoder. If the control circuit 102 comprises a subtraction unit, the phase differences of the output clock relative to the rising edge of the input clock is −ΔΦ, −2 ΔΦ, A second embodiment of the present invention is now explained. FIG. 3 illustrates a structure of the second embodiment of the present invention. Referring to FIG. 3, the second embodiment includes a frequency divider 103 for frequency dividing input clock, a control circuit 102 and a phase adjustment circuit 101. The frequency divider 103 is fed with an input clock to frequency divide the input clock for outputting a frequency divided clock.

The control circuit 102 comprises an adder for incrementing code signals m (m=1, 2, 3, . . . ) from an initial value 0 to (0, 2m, 3m, . . . ) each time it is fed with the input clock, and a decoder for decoding the output of the adder to output a selection signal associated with the decoded value to the phase adjustment circuit 101.

With a unit phase difference of ΔΦ, the phase adjustment circuit 101 outputs a signal comprising pulse edges with phase differences of 0, m ΔΦ, 2 m ΔΦ, 3m ΔΦ, . . . , (n−1)n ΔΦ, nm ΔΦ, . . . , from corresponding edges of the input clock, based on the selection signal from the control circuit 102, from one input clock to another. It is noted that, with the unit phase difference ΔΦ equal to tCK/n, nm ΔΦ is equivalent to phase difference 0.

A frequency f=1/tCK of the input clock with a period of tCK is converted into a frequency=1/(tCK+ΔΦ), with the period of the output clock being tCK+ΔΦ), such that the clock period can be changed to a value other than an integer ratio.

In the present second embodiment, the control circuit 102 may, of course, be made up of a subtraction unit and a decoder.

Figure 4:
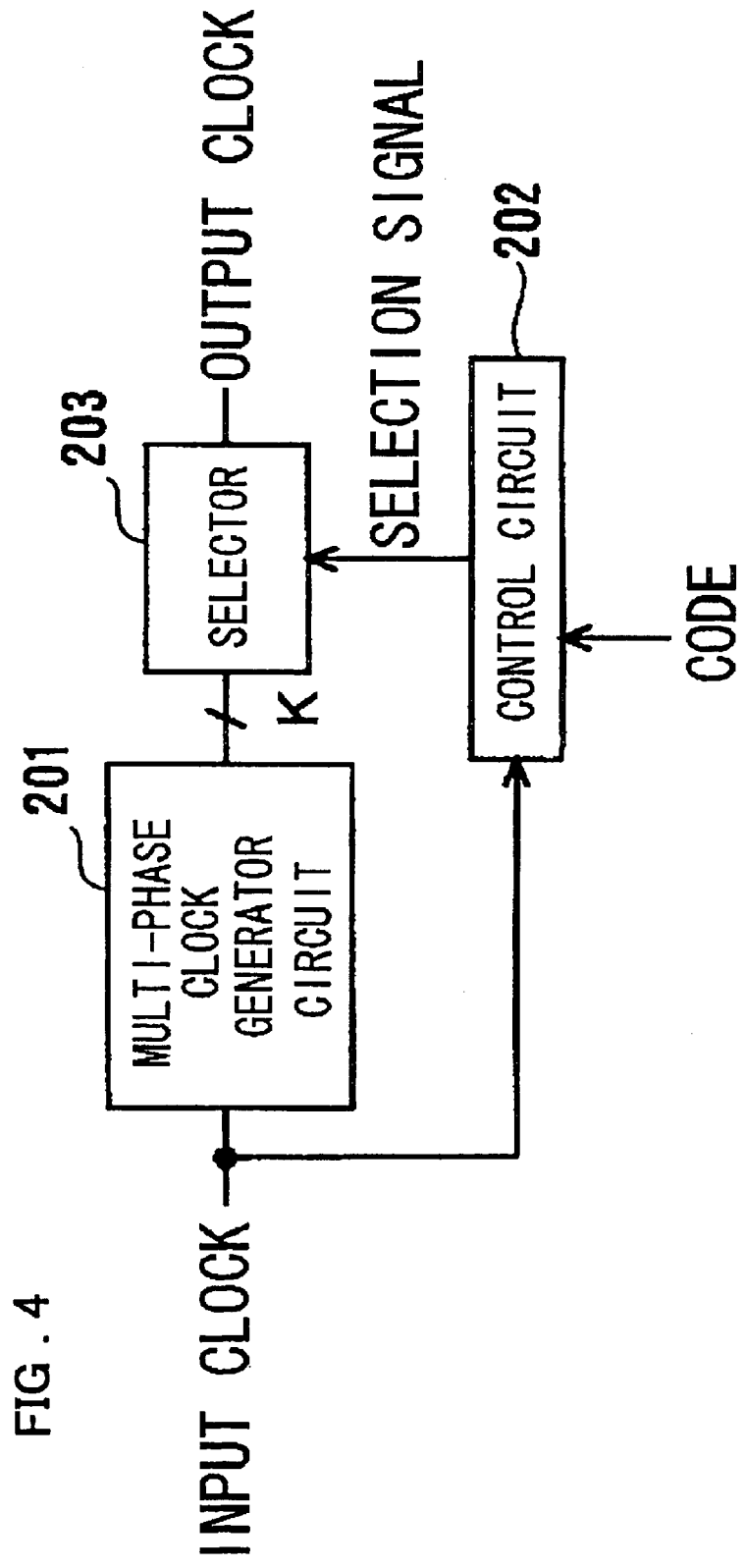
FIG. 4 shows a configuration of a third embodiment of the present invention.

A third embodiment of the present invention is now explained. FIG. 4 illustrates a structure of the third embodiment of the present invention. Referring to FIG. 4, the present third embodiment includes a multi-phase clock generator 201, a selector 202 and a control circuit 203 for supplying a selection signal to the selector 202.

The multi-phase clock generator 201 output n th clocks, a timing (phase) difference between clocks with neighboring phases clocks is ΔΦ=tCK/n.

The first to the nth clocks are selected in a cyclic way by the selector 202, under control by the control circuit 203, such that the first clock is selected in a clock cycle 1, with the phase difference of the output clock relative to the rising edge of the input clock being 0;

the second clock is selected in a clock cycle 2, with the phase difference of the output clock relative to the rising edge of the input clock being ΔΦ; and the third clock is selected in a clock cycle 3, with the phase difference of the output clock relative to the rising edge of the input clock being 2 ΔΦ, and so on.

The period of the output clock is tCK+ΔΦ, such that the frequency f=1/tCK of the input clock with the period tCK is converted to the frequency=1/(tCK+ΔΦ), to render it possible to convert the clock period with a value other than an integer (=1+ΔΦ/tCK).

The above-described embodiment of the present invention will be explained in further detail. In the following, the present embodiment is explained in detail based on the circuit structure shown in FIG. 4, in consideration of a sequence of explanation of the timing difference circuit (interpolator) characteristic of the present invention.

Figure 5:
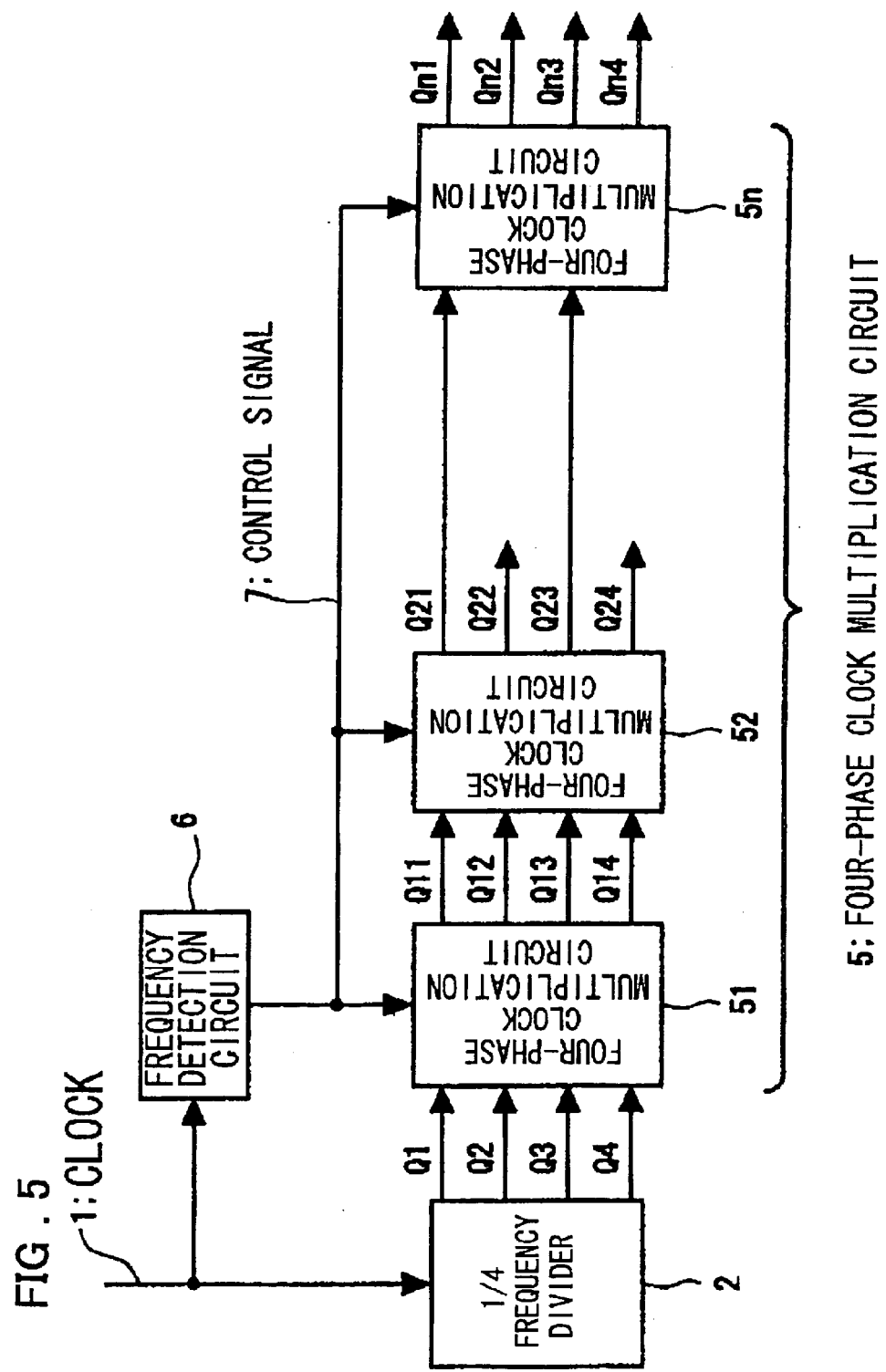
FIG. 5 shows an illustrative structure of a multi-phase clock generating circuit of a third embodiment of the present invention.
Figure 6:
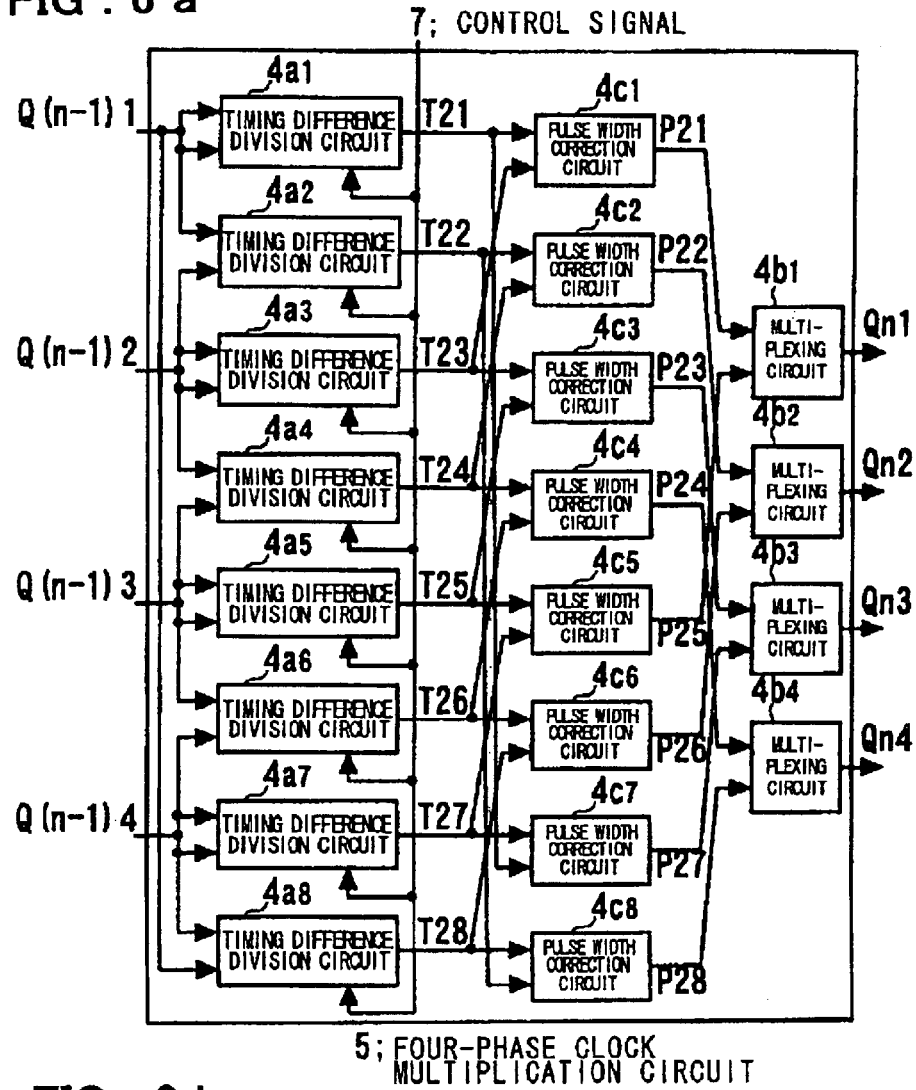
FIG. 6 shows an illustrative structure of the four-phase clock generating circuit of the third embodiment of the present invention.
Figure 6:
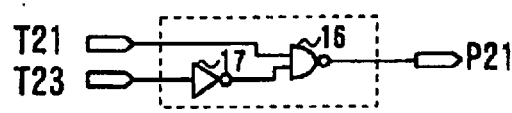
Figure 6:
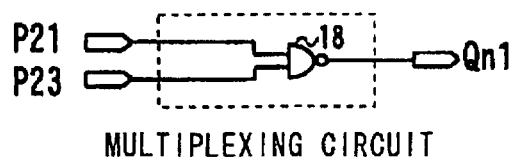

FIG. 5 illustrates an example of a structure of the multiphase clock generator 201 shown in FIG. 4. FIG. 6 shows a specified embodiment of the structure of a multiplication interpolator embodying the present invention as a multiphase clock generator 201 generating four-phase clocks.

Referring to FIG. 5, the four-phase clock generator includes a ¼ frequency divider 2 for frequency-dividing an input clock 1 by four to output four-phase clocks Q1 to Q4, a n-stage cascade-connected four-phase clock multiplication circuits(termed frequency doubling circuits) 51 to 5n and a period detection circuit 6. Meanwhile, the number of the stages n of the four-phase clock multiplication circuits is arbitrary.

The ¼ frequency divider 2 divides a frequency of the input clock by ¼ to generate four-phase clocks Q1 to Q4, which then are multiplied by the four-phase clock multiplication circuit 51 to generate four-phase clocks Q11 to Q14. Similarly, four-phase clocks Qn1 to Qn4 are obtained by the four-phase clock multiplication circuit 5n by 2n frequency multiplication.

The period detection circuit 6 is made up of a fixed number of stages of ring oscillators and a counter, both bot shown. During one clock period, the number of oscillations of the ring oscillator is counted by the counter and a control signal 7 corresponding to the number of counts is output to adjust a load in the four-phase clock multiplication circuit 5. This period detection circuit 6 operates to eliminate fluctuations in device characteristics and in the operating range of the clock period.

FIG. 6a illustrates a structure of the four-phase clock multiplication circuit 5 shown in FIG. 5. Meanwhile, the four-phase clock multiplication circuits 51 to 5n shown in FIG. 5 are of the same structure. Referring to FIG. 6a, this four-phase clock multiplication circuit 5 is made up of eight timing difference division circuits 4a1 to 4a8, eight pulse width correction circuits 4c1 to 4c8 and four multiplexing circuits 4b1 to 4b4. FIG. 6b shows a structure of a pulse width correction circuit 4c, comprised of a NAND circuit 16 fed with a signal corresponding to a second input complemented by the inverter 17 and with a first input. FIG. 6c shows a structure of the multiplexing circuit 4b comprised of a two-input NAND circuit 18.

Figure 7:
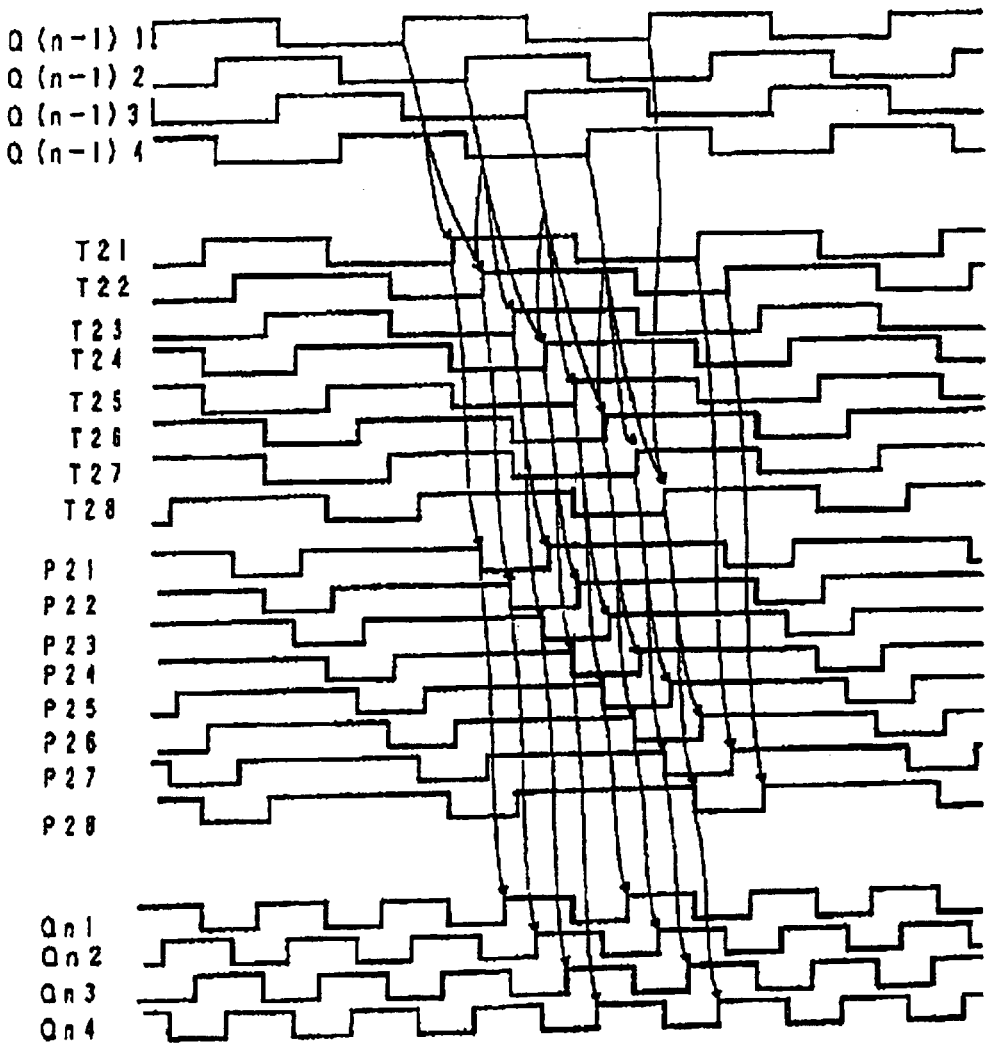
FIG. 7 is a timing diagram for illustrating the operation of the four-phase clock generating circuit of the third embodiment of the present invention.

FIG. 7 illustrates signal waveforms diagram for explaining operational timing of the four-phase clock multiplication circuit 5 shown in FIG. 6. A rise timing of the clock T21 is determined by an internal delay of the timing difference division circuit 4a1 from a rising edge of the clock Q(n-1)1, whilst a rise timing the clock T22 is determined by a timing division of a difference between a rise timing of the clock Q(n-1) and a rise timing of the clock Q(n-1)2, and an internal delay of in the timing difference division circuit 4a2.

Similarly, rise timing of the clock T26 is determined by a timing division of a difference between a rise timing of the clock Q(n-1)3 and it rise timing of the clock Q(n-1)4 and the internal delay in the timing difference division circuit 4a2, a rise timing of the clock T27 is determined by the internal delay of a rise timing of the clock Q(n-1)2 in the timing difference division circuit 4a7 and a rising edge of the clock T28 is determined by a timing division of a difference between a rise timing of the clock Q(n-1)4 and a rise timing of the clock Q(n-1)1 and the internal delay in the timing difference division circuit 4a8.

The clocks T21 and T23 are fed to the pulse width correction circuit 4c1 which then outputs a pulse P21 having a falling edge determined by the clock T21 and a pulse P21 having a rising edge determined by the clock T23. By a similar sequence of operations, pulses P22 to P28 are generated, with the clocks P21 to P28 being duty 25% eight-phase pulses, evenly spaced by phase 45°. The clock P25, spaced by 180° from the clock P21, is multiplexed and inverted by the multiplexing circuit 4b1 and output as a duty 25% clock Qn1.

In similar manner, clocks Qn2 to QN4 are generated. The clocks Qn1 to QN4 become duty 50% four-phase pulses, equally-spaced b) 90° The clocks Qn1 to QN4 are frequency multiplied by a factor of two in the course of generating the clocks Qn1 to Qn4 from the Q(n-1)1 to Q(n-1)4.

Figure 8A:
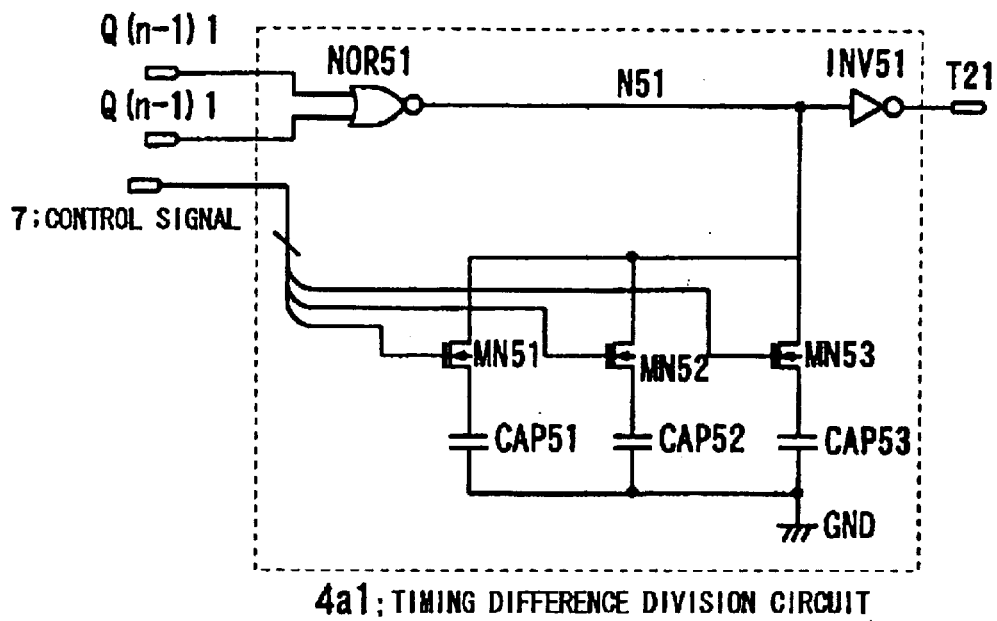
FIG. 8 shows an illustrative structure of a circuit configuration of a timing difference division circuit (interpolator) of FIG. 6.
Figure 8B:
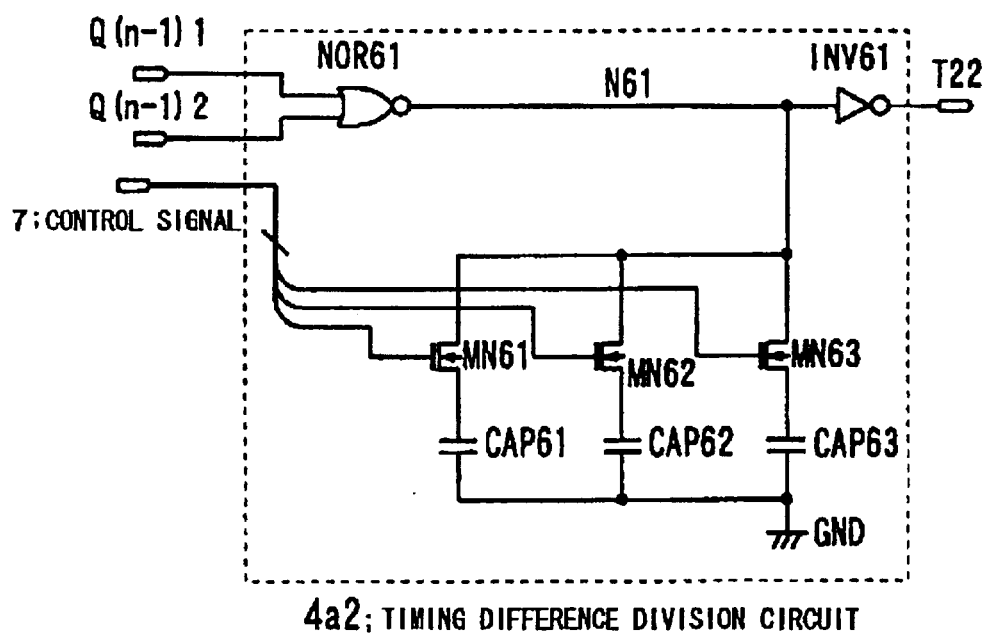

FIG. 8a and FIG. 8b illustrate typical structures of the timing difference division circuits 4a1 and 4a2, respectively, shown in FIG. 7. These circuits are of the same structure and differ as to whether the two inputs are the same signal or two neighboring signals are input. That is, the timing difference division circuits 4a1 and 4a2 are the same in structure except that the same input Q(n-1)1 is input to a two-input NOR 51 in the timing difference division circuit 4a1 whereas Q(n-0)1 and Q(n-1)2 are input to the two-input NOR 61. The two-input NORs 51, and 61 are comprised of two P-channel MOS transistors connected in series across the power source VDD and an output end and are connected in parallel across and to the gate of which input signals IN1, IN2 are fed, and two N-channel MOS transistors connected in parallel across an output terminal and the ground and to the gates of which are fed input signals IN1, IN2.

An internal node N51 (N61) as an output node of the two-input NOR 51 (NOR 61) is connected to an input terminal of an inverter INV51 (INV61). Across the internal node and the ground are connected, in parallel, a circuit comprised of a serial connection of a N-channel MOS transistor MN 51 and a capacitor CAP 51, a circuit comprised of a serial connection of a N-channel MOS transistor MN 52 and a capacitor CAP 52 and a circuit comprised of a serial connection of a N-channel MOS transistor MN53 and a capacitor CAP 53. The gates of the respective MOS transistors MN51 to MN53 are fed with control signals 7 from the period detection circuit 6 so as to be thereby turned on or off. The gate widths of the MOS transistors MN51 to MN53 and the capacitors CAP 51 to CAP 53 are controlled to a size ratio of for example, 1:2:4, with the clock period being set by adjusting the load connected to the common node in eight stages based on the control signal 7 output from the period detection circuit 6 (see FIG. 5).

FIG. 9 shows a timing diagram for explaining the operation of the timing difference division circuits 4a1 and 4a2.

As for the timing difference division circuit 4a1, electrical charge of the node N51 is extracted through an N-channel MOS transistor of the NOR 51 and, as a potential of the node N51 has reached a threshold value of the inverter N51, the clock T21 as an output of the inverter INV51 rises.

Assuming that a value of the electrical charge of the node N51, that need to be extracted when the threshold value of the inverter INV 51 is reached, is CV, where C and V denote capacitance and voltage, respectively, and a discharge current by the N-channel MOS transistor of NOR 51 is I, the electrical charge CV is discharged with a current value 2I as from the rising of the clock Q(n-1)1. So, the time CV/2I denotes a timing difference (propagation delay time) as from the rising edge of the clock Q(n-1) until the rising of the clock T21. With the clock Q(n-1)1 at Low level(logic low), the output side node N51 of the two-output NOR 51 is charged to High level(logic high), with the output clock of the inverter INV 51 falls to Low level.

As for the timing difference division circuit 4a2, the electrical charge at the node N61 are extracted to NOR 61 during the time as from a rising edge of the clock Q(n-1)1 until time tCKn (tCKn clock period). When a potential of the node N61 has reached a threshold value of the inverter INV 61, as from a rising edge of the Q(n-1)2, the edge of the clock T22 rises.

If the electrical charge of the node N61 is CV and a discharge current of the NMOS transistor of the two-input NOR 61 is I, and the electrical charge CV is extracted from a rising edge of the clock Q(n-1)1 with the current I during time of tCKn, and with the current 2I for the remaining time, the time $$tCKn+(CV-tCKn\cdot I)/2I=CV/2I+tCKn/2 \quad (1)$$

denotes the timing difference as from the rising edge of the clock Q(n-1) until the rising edge of the clock T22.

That is, a difference of rise timings between clocks T22 and T21 is tCKn/2.

If both the clock Q(n−1)1 and Q(n−1)2 are at Low level and the output side node N61 of the two-input NOR 61 is charged to High level from the power source through the PMOS transistor of NOR 61, the clock T22 rises.

The same holds for the clocks T22 to T28, with the rising timing difference of the clocks T21 to t28 being each tCKn/2.

The pulse correction circuits 4c1 to 4c8 (FIG. 6) generate duty 25% eight-phase pulses P21 to P28, dephased each 45° (see FIG. 7).

The multiplexing circuits 4b1 to 4b4 (see FIG. 6) generate duty 50% four-phase pulses Qn1 to Qn4, dephased each by 90°, as shown in FIG. 7.

If clocks Qn1 to Qn4 of FIG. 7 are output from the four-phase clock generator 201, the selector 203, fed with Qn1 to Qn4, sequentially selects and outputs the clocks Qn1 to Qn4, in a sequence of the Qn1, Qn2, Qn3 and Qn4 under control by a selection signal from the control circuit 202. With a period T of the clocks being Qn1 to Qn4, clock with a period of T(1+¼) are output from the selector 203.

Figure 10:
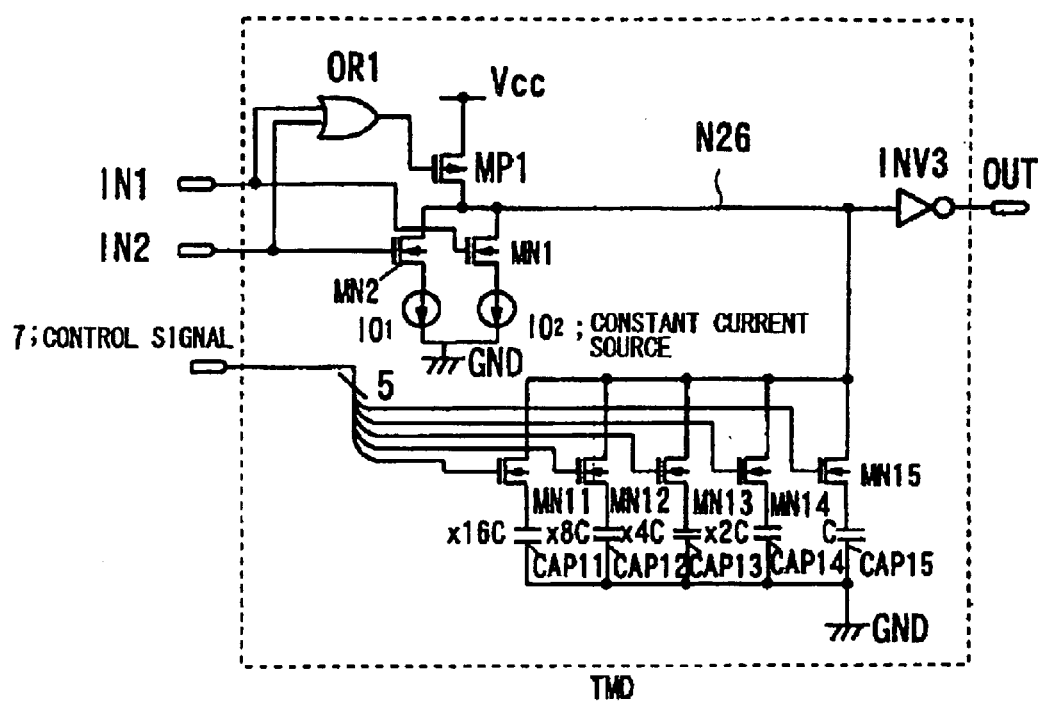
FIG. 10 shows a modification of a timing difference division circuit (interpolator).

FIG. 10 shows another embodiment of the timing difference division circuit used in the four-phase clock multiplication circuit shown in FIG. 6 etc. Referring to FIG. 10, in the timing difference division circuit, a logical OR circuit OR1 receives a first and second input signals IN1, IN2.

A P-channel MOS transistor MP1 is connected across the power source VCC and an internal node N26 and a gate of MOS transistor MP1 is fed with an output signal of the logical OR circuit OR1.

An inverter INV3 has its input terminal connected to the internal node N26 for inverting and outputting a potential of the internal node N26.

N-channel MOS transistors MN1, MN2, have drains, gates and sources connected to the internal node N26, fed with the first and second input signals IN1, IN2 and connected to a constant current source $I_o$, respectively.

Across the internal node N26 and the ground are connected switching devices MN11 to MN15, comprised of N-channel MOS transistors, and the capacitors CAP 11 to CAP15.

To control terminals (gate terminals) of the switching devices MN11 to MN15, comprised of N-channel MOS transistors, are coupled control signals 7 output from the period detection circuit 6 of FIG. 5, as in the case of the timing difference division circuits explained with reference to FIG. 8.

The switching devices MN11 to MN15 are controlled on or off depending on value of the control signal 7 to decide capacitance value to be attached to the internal node N26.

The capacitance ratio of the capacitors CAP 11 to CAP15 is set to such as 16:8:4:2.1, with the ratios of the gate widths (W) to the gate lengths (L) of the N-channel MOS transistors MN11 to MN15 being 16:8:4:2:1.

If the first and second input signals IN1, 1N2 are at Low level, an output of the OR circuit OR is low, such that the P channel MOS transistor MP1 is turned on to charge the internal node N26 to the power source potential, with the output of the inverter INV3 then being at Low level.

If one or both of the first and second input signals IN1, IN2 is or are at High level, an output of the logical OR circuit OR1 changes to High level, and the P-channel MOS transistor MP1 is tuned off, so that the power source path of the power source Vcc and the internal node N26 is turned OFF.

On the other hand, one or both of the N-channel MOS transistors MN1 and MN2 are turned ON to discharge the internal node N26 so that the potential of the internal node N26 starts to be decreased from the power source potential. When the potential of the internal node N26 falls to below the threshold voltage of the inverter INV3, an output of the inverter INV3 rises from Low level to High level.

FIG. 11 illustrates operation of the timing difference division circuit TMD shown in FIGS. 8 and 10. Referring to FIG. 11a, first one of three timing difference division circuits (TMD) is fed at its two inputs with the same input signal IN1 to output an output signal OUT1, while second timing difference division circuit (TMD) is fed at its two inputs with input signals IN1 and IN2 to output an output signal OUT2 and third timing difference division circuits (TMD) is fed at its two inputs with the same input signal IN2 to output an output signal OUT3.

Of these, the second timing difference division circuit (TMD), fed with the input signals IN1, IN2 to output the output signal OUT2, corresponds to the structure of the timing difference division circuit of FIG. 8b.

The timing difference division circuit (TMD) fed with IN1 in common and the timing difference division circuit (TMD) fed with IN2 in common are fed with the same signal in FIG. 8a and corresponds to the structure of the timing difference division circuit 4a2 of FIG. 8a.

FIG. 11b shows output signals OUT1 to OUT3 of the first to third timing difference division circuits, fed with the input signals IN1, IN2 of the timing difference T, and changes A1 to A3 of the internal nodes of the first to third timing difference division circuits.

For ease of understanding, it is assumed that the internal node is charged from an electrical potential 0 and that the output signal is changed from low to High level when the threshold value Vt is exceeded.

Referring to FIG. 1b, there is timing difference between the input signals IN1 and IN2, the first timing difference division circuit TMD outputs an output signal OUT1 with a delay time(propagation delay) t1, the third timing difference division circuit TMD outputs an output signal OUT3 with a delay time t3 and the second timing difference division circuit TMD outputs an output signal OUT2 with a delay time t2, with the delay time t2 being a value corresponding to internal division of the delay time t1 and the delay time t3.

Meanwhile, $$t1=CV/2I,$$

$$t2=T+(CV-IT)/(2I)-T/2+CV/2I \quad (2)$$

On the other hand, T+CV/2I (see FIG. 11c), provided that electrical charge discharged until the threshold value of a buffer circuit (inverter) to which is connected the inner node are denoted CV.

The structure of an interpolator, used in e.g., the phase adjustment circuit 101 in the embodiment of the present invention and in which the ratio of internal division of the timing differences of the two input signals can be variably set, is explained.

Figure 12:
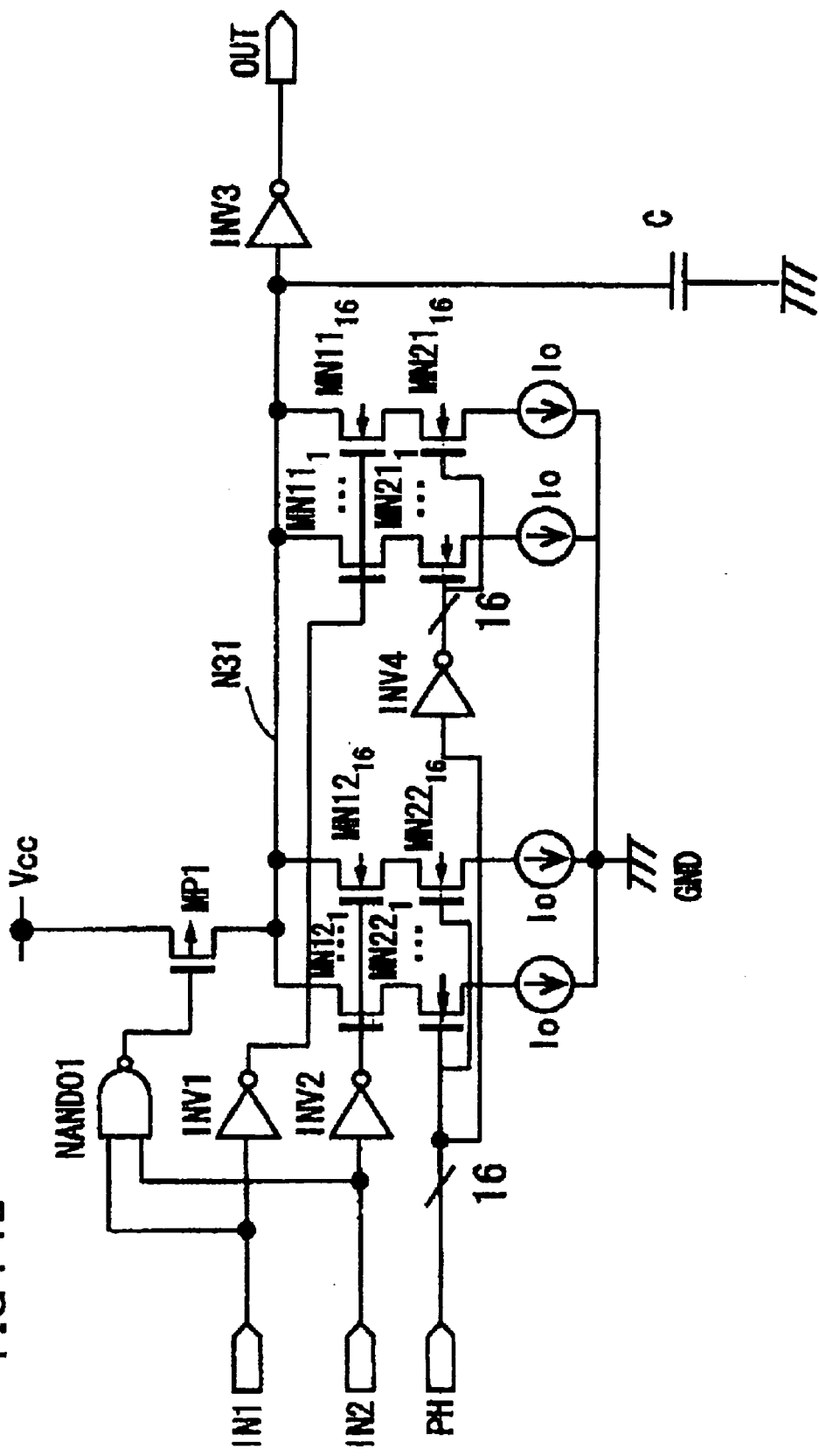
FIG. 12 shows a first embodiment of the circuit configuration of a variable internal division ratio interpolator used in an embodiment of the present invention.

FIG. 12 illustrates a structure of an interpolator forming the phase adjustment circuit 101 and in which a internal division ratio of timing difference can be variably set such as in a programmable manner.

Referring to FIG. 12, in this interpolator, a P-channel MOS transistor MP1 has a source and a drain connected respectively to the power source Vcc and to a internal node N31, respectively, and having a gate fed with an output signal of a NAND circuit NAND 01 that receives a first and second input signals IN1, IN2.

A inverter circuit INV3 of which input terminal is connected to the internal node N31, switches a logical value of an output signal when relation of magnitude of the internal node potential and a threshold potential value of the inverter circuit INV3 are changed.

Inverter circuits INV1, INV2 have input terminals connected respectively to the first and second input signals IN1, IN2.

16 N-channel MOS transistors $MN11_1$ to $MN11_{16}$ have drains connected in common to the internal node N31 and have gates connected in common to an output of the inverter circuit INV1.

16 N-channel MOS transistors (switching devices) $MN12_1$ to $MN12_{16}$ have drains connected in common to the internal node N31 and gates connected in common to an output of the inverter circuit INV2. 16 N-channel MOS transistors $MN21_1$ to $MN21_{16}$ (switching devices) have drains connected to the sources of N-channel MOS transistors $MN11_1$ to $MN11_{16}$ and sources connected to the constant current source $I_o$ and having gates connected to an output of an inverter circuit INV4 that receives and inverts a selection signal PH of a control circuit, such as a control circuit 102 of FIG. 1. 16 N-channel MOS transistors $MN21_1$ to $MN21_{16}$ are switched on or off on by a selection signal PH.

16 N-channel MOS transistors $MN22_1$ to $MN22_{16}$ (switching devices) have drains connected to the sources of N-channel MOS transistors $MN12_1$ to $MN12_{16}$ and have sources connected to the constant current source $I_o$, respectively, and having gates connected to and switched on or off by a selection signal PH of a control circuit, such as a control circuit 102 of FIG. 1.

A capacitance C is connected across the internal node N31 and the ground GND.

The operation of the internal division in which N (N being 0 to 16, with N=0 denoting no transistor being turned on and N being determined by the control signal PH) of 16 parallel N-channel MOS transistors are turned on with the input signal IN1, and in which (16−N) parallel N-channel MOS transistors are turned on after time T with the input signal IN2, with the sum total of N+(16−N)=16 N-channel MOS transistors being turned on the whole, is hereinafter explained.

Current flowing through one of parallel N-channel MOS transistors is I which is equal to a current value of the constant current source $I_o$.

With a threshold voltage V for switching an output of the inverter INV3, an amount of electrical charge required for reaching to the threshold voltage is assumed to be CV.

It is assumed that the input signals IN1, IN2 are both at High level, an output of the NAND 01 is at Low level and the internal node N31 has been charged from the power source through the P-channel MOS transistor MP1. It is also assumed that, in this state, the input signals IN1, IN2 fall to the Low level.

First, with N=16, 16 of the 16 N-channel MOS transistors $MN11_1$ to $MN11_{16}$ are turned on. After time T, 16 parallel N-channel MOS transistors $MN12_1$ to $MN12_{16}$ are turned off by the input signal IN2 ((16−N)=0)). As a result, if N=16, the time T (16) until the output of the inverter INV3 is inverted after the input signal IN1 goes low is $$T(16)=CV/(16 \cdot I) \qquad (3).$$

With N=n (n<16), where N is set by the control signal PH, n N-channel MOS transistors, the gates of which are fed with an inverted signal of the input signal IN1, are turned on during the time T since the input signal IN1 falls at Low level, with T being the timing difference between the input signals IN1 and IN2, so that n·I·T charges are discharged.

The input signal IN2 falls at Low level, so that 16−n N-channel MOS transistors, the gates of which are fed with inverted signals of the input signal IN2, are turned on. Thus, a sum total of the 16 N-channel MOS transistors are turned on.

At a time point T' when electrical charges left in the internal node N31 (CV−n·I·T) are discharged at (16·I), an output of the inverter INV3 is inverted, that is, goes from the High level to the Low level). The time T' is given by $$(CV-n \cdot I \cdot T)/(16 \cdot I).$$

So, time T(n) which elapses since the input signal IN1 falls at Low level until the output of the inverter INV3 is inverted is given by $$\begin{aligned}T(n) &= (CV - n \cdot I \cdot T)/(16 \cdot I) + T/(16 \cdot I) + T \\ &= CV/(16 \cdot I) - (n/T)T + T \\ &= T(16) + (16-n)/16 \cdot T \ldots \quad (4).\end{aligned}$$

By a value of n, output signal resulting having a phase that is 16 equal division of timing difference T between the input signals IN1, IN2 are obtained. That is, by setting the control signal to vary n, an output signal with arbitrarily phase that is divided on a resolution 1/16 of the timing difference between the input signals IN1, IN2 are obtained. This interpolator is termed 16-step interpolator.

In general, if an interpolator is to be an M step interpolator, where M is an optional positive integer, M sets of N-channel MOS transistors MN11, MN12, MN13 and MN14 are arrayed in parallel.

The input IN1, IN2 of these interpolators are fed with two signals with a timing difference of e.g., 1 clock period tCK, and timing differences 0, tCK/16, 2tCK/16, are output from the input IN1 each input clock to generate signals of clock period equal to tCK (1+1/16).

Figure 13:
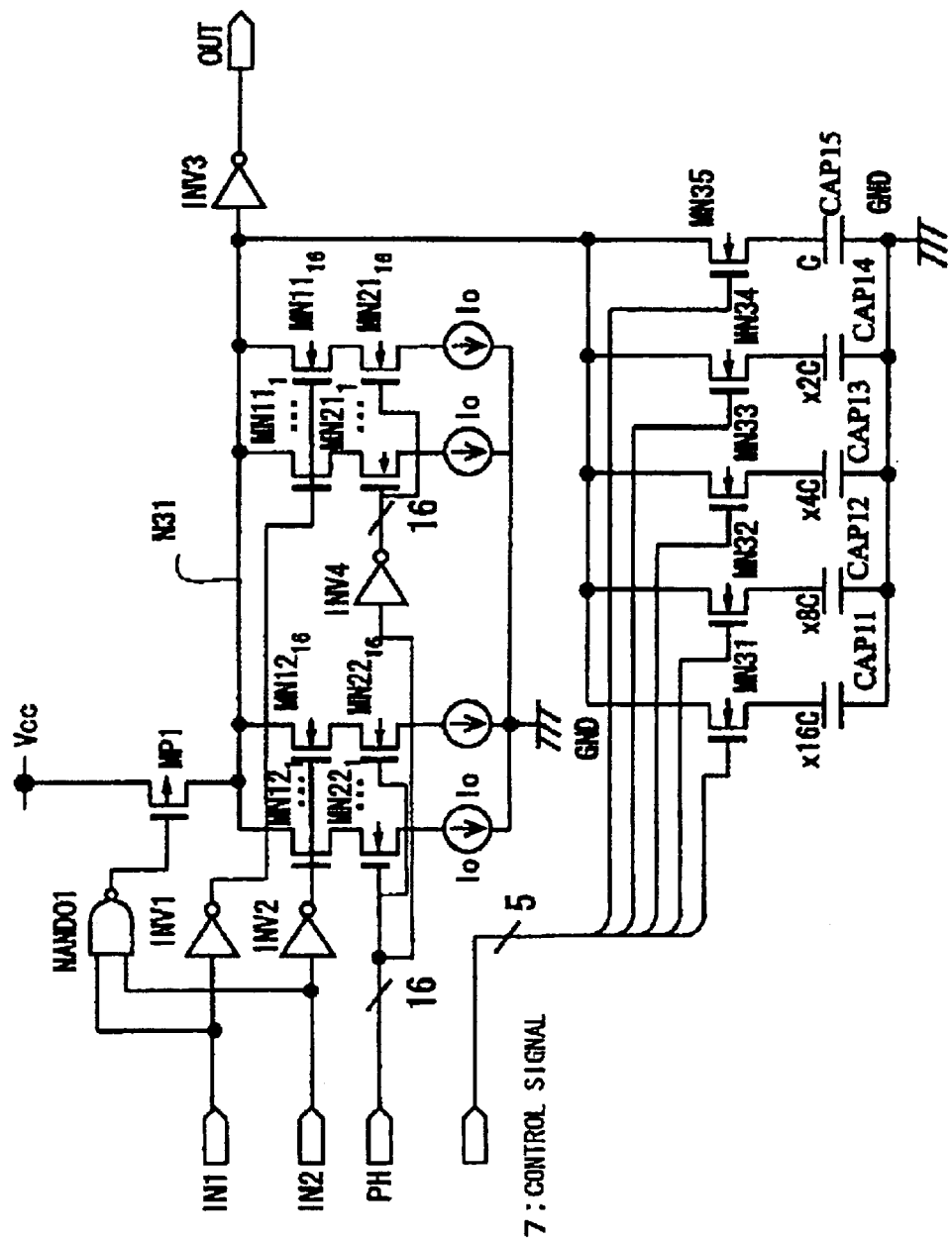
FIG. 13 shows a second embodiment of the circuit configuration of a variable internal division ratio interpolator used in an embodiment of the present invention.

FIG. 13 illustrates a circuit structure of an interpolator forming the phase adjustment circuit 101 of FIG. 1. Referring to FIG. 13, in this interpolator, a plurality of series circuits connected in parallel across the internal node N31 and the ground are added to the circuit structure shown in FIG. 12. Each of the series circuits is comprised of N-channel MOS transistor switches and capacitors. Specifically, these serial circuits are made up of switching devices MN21 to MN35 and capacitors CAP11 to CAP15. The capacitance attached to the internal node is determined by the control signals connected to the control terminals of switching devices MN11 to MN15. The capacitors CAP11 to CAP15 are of capacitance values C, 2C, 4C, 8C and 16C, with the capacitance values added to the internal node being variably determined by the values of the periodic control signal 7 of the switching devices MN11 to MN15. The periodic control signal 7 are set from outside and may, for example, be a control signal 7 supplied from the period detection circuit 6 shown for example in FIG. 5.

In the interpolator shown in FIG. 12, the input node N31 is charged to the power source potential when both the input signals IN1, IN2 are at High level, with the internal node N31 being discharged responsive to decay transition of the input signals IN1, IN2 from the High level to the Low level, with the output signal then rising from Low level to High level. Alternatively, the output signal may rise from Low level to High level responsive to a rise transition from Low level to High level of the input signal. For realizing the logic of the output signal going low from high responsive to the fall transition from High level to Low level of the input signals IN1, IN2, it is sufficient if the inverter INV3 as a reversal buffer is designed as a non-inverting buffer circuit.

Figure 14:
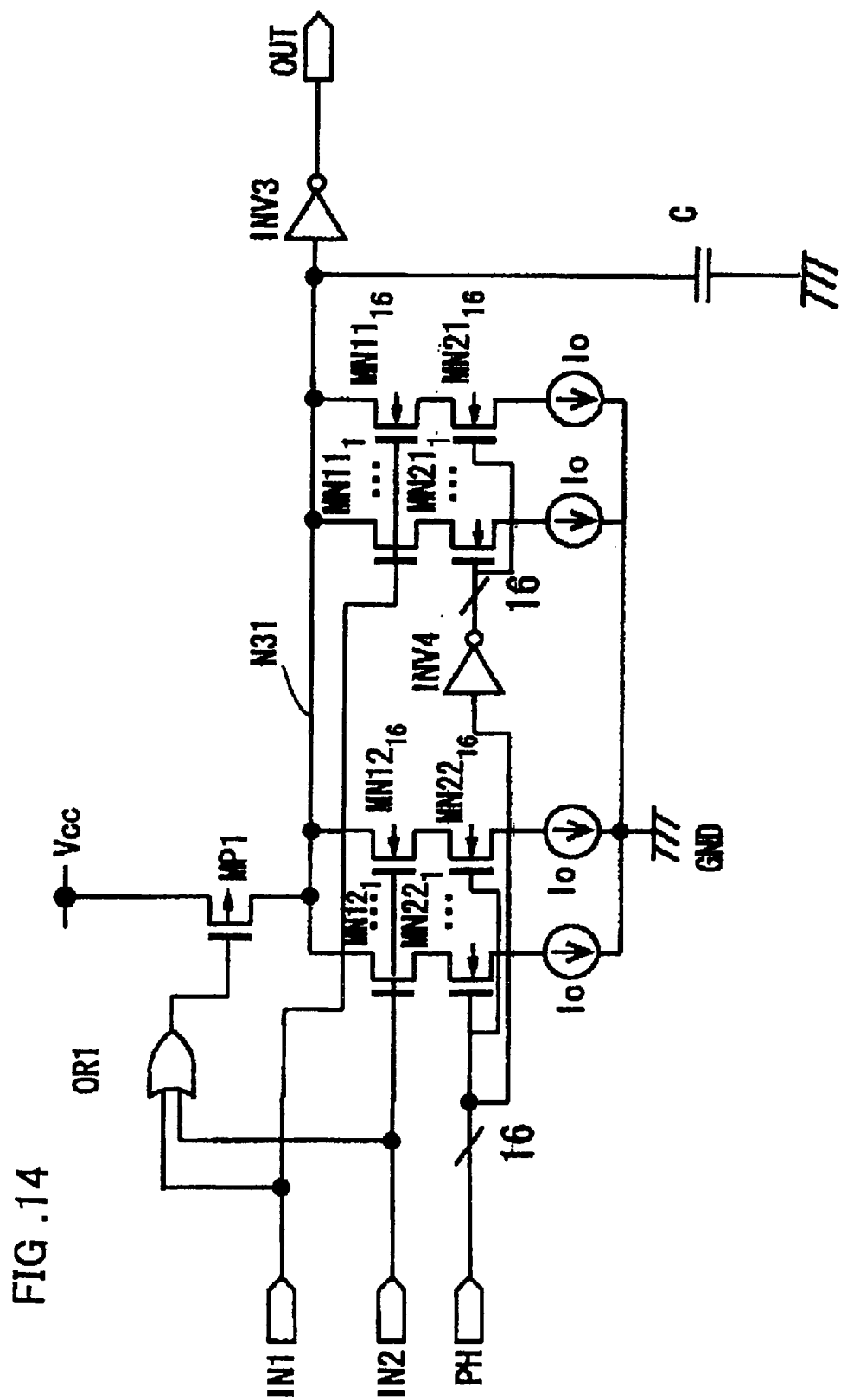
FIG. 14 shows a third embodiment of the circuit configuration of a variable internal division ratio interpolator used in an embodiment of the present invention.

FIG. 14 illustrates an alternative circuit structure of an interpolator forming the phase adjustment circuit 101 shown in FIG. 1. Referring to FIG. 14, the interpolator comprises a P-channel MOS transistor MP1, having a source and a drain connected to a power source and to the internal node N31, respectively, and having a gate fed with an output signal of a NOR circuit NOR 01 fed in turn with the first and second input signals IN1, IN2, and an inverter circuit INV3 for switching the logical value of an output signal when the relative magnitude of the internal node potential and the threshold potential value is changed.

The interpolator also includes 16 N-channel MOS transistors $MN11_1$ to $MN11_{16}$ having drains and gates connected in common to the internal node N31 and to the input signal IN1, respectively, and 16 N-channel MOS transistors (switching devices) MN12, to $MN12_{16}$ having drains and gates connected in common to the internal node N31 and to the input signal IN2, respectively.

The interpolator also includes 16 N-channel MOS transistors $MN21_1$ to $MN21_{16}$ (switching devices) having drains and sources connected to the sources of N-channel MOS transistors $MN11_1$ to $MN11_{16}$ and to the constant current source $I_o$, respectively, and having gates connected to an output of an inverter circuit INV4 and turned on or off. The inverter circuit INV4 is fed with a selection signal PH of a control circuit, such as a control circuit 102 of FIG. 1.

In addition, the interpolator includes 16 N-channel MOS transistors $MN22_1$ to $MN22_{16}$ (switching devices) having drains and sources connected to the sources of N-channel MOS transistors $MN12_1$ to $MN12_{16}$ and to the constant current source $I_o$, respectively, and having gates connected to and turned on or off by a selection signal PH of a control circuit, such as a control circuit 102 of FIG. 1.

Figure 15:
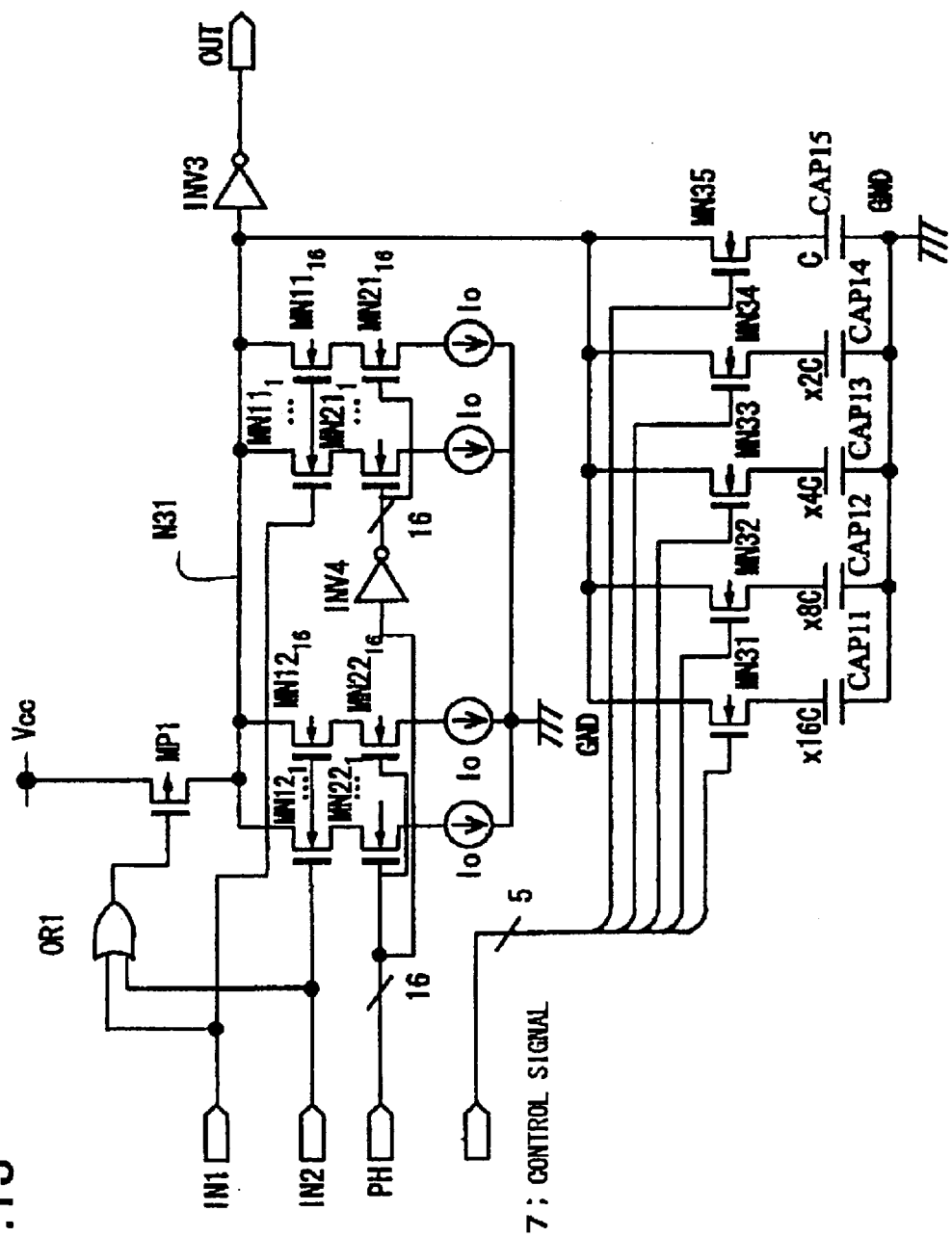
FIG. 15 shows a fourth embodiment of the circuit configuration of a variable internal division ratio interpolator used in an embodiment of the present invention.

FIG. 15 illustrates a structure in which a plurality of series circuits, each comprised of N-channel MOS transistor switches and capacitors, and being connected in parallel across the internal node N31 and the ground are added to the circuit structure shown in FIG. 14. Specifically, these serial circuits are made up of switching devices MN21 to MN35 and capacitors CAP11 to CAP15. The capacitance attached to the internal node is determined by the control signals connected to the control terminals of switching devices MN11 to MN15. The capacitors CAP11 to CAP15 are of capacitance values C, 2C, 4C, 8C and 16C, with the capacitance values added to the internal node being variably determined by the values of the periodic control signal 7 of the switching devices MN11 to MN15. The periodic control signal 7 is set from outside and may, for example, be the control signal 7 supplied from the period detection circuit 6 shown for example in FIG. 5.

In circuit configurations of the interpolators shown in FIGS. 12 to 15, locations of transistors $MN12_1$ to $MN12_{16}$ and transistors $MN22_1$ to $MN22_{16}$ may be interchanged and locations of transistors $MN11_1$ to $MN11_{16}$ and transistors $MN21_1$ to $MN21_{16}$ may be interchanged. For example, the interpolators shown in FIGS. 12 to 15 may be preferably configured in such a structure wherein drains of the transistors $MN22_1$ to $MN22_{16}$ of which gates are connected in common to the selection signal PH are connected to the node N31, and drains of the transistors $MN12_1$ to $MN12_{16}$ of which gates are connected to the input terminal IN2 are connected respectively to sources of the transistors $MN22_1$ to $MN22_{16}$ while sources of the transistors $MN12_1$ to $MN12_{16}$ are connected respectively to corresponding current sources 10, and wherein drains of the transistors $MN21_1$ to $MN21_{16}$ of which gates are connected in common to the output of the inverter INV4 are connected to the node N31, and drains of the transistors $MN11_1$ to $MN11_{16}$ of which gates are connected to the input terminal IN1 are connected respectively to sources of the transistors $MN21_1$ to $MN21_{16}$ while sources of the transistors $MN11_1$ to $MN_{16}$ are connected respectively to corresponding current sources 10.

Figure 16:
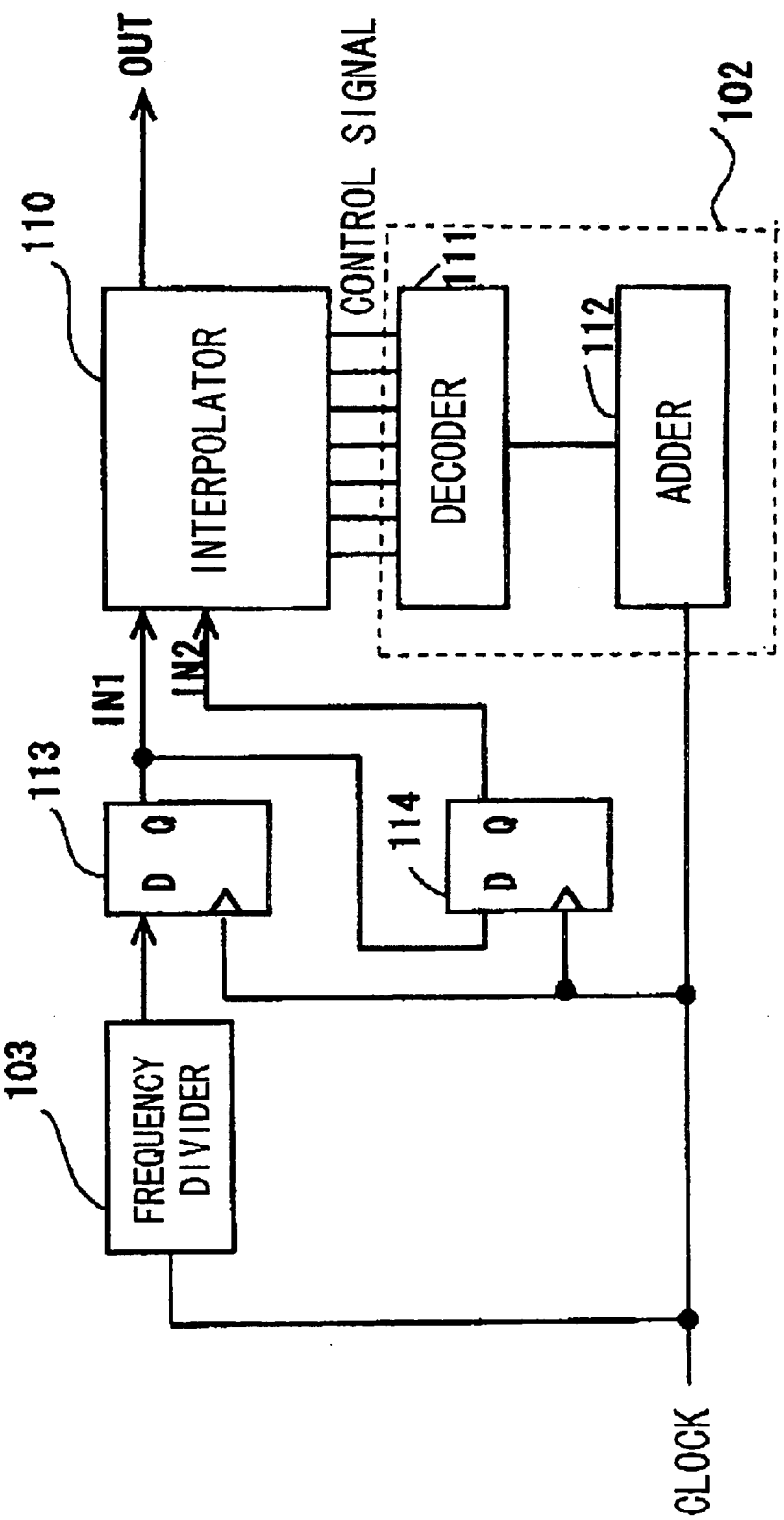
FIG. 16 shows the configuration of a fourth embodiment of the present invention.

A further embodiment of the present invention is explained. FIG. 16 shows a structure of a fourth embodiment of the present invention, according to which, in the clock control circuit comprised of the frequency divider 103, phase adjustment circuit 101 and the control circuit 102, shown in FIG. 3, the phase adjustment circuit 101 is formed by an interpolator shown in FIGS. 12 to 15.

The interpolator 110 receives a first and second input signals IN1, In2. The first input signal IN1 is a clock signal supplied from a first D-flipflop 113 that latches with a clock fed to a clock terminal thereof, a signal which is a frequency-divided clock from a frequency divider 103 that received a clock and is fed to a data input terminal thereof and the second input signal IN2 is a clock signal supplied from a second D-flipflop 114 that latches with a clock fed to a clock terminal thereof, an output signal from the D-flipflop 113.

The interpolator 110 divides timing difference of the first and second input signals IN1, IN2 (period tCK of the clocks CLK) with an internal division ratio as set by a control signal (selection signal) output by a control circuit 102 which comprises an adder 112 that receives the clock and a decoder 111 that decodes an output of the adder 112.

Figure 17:
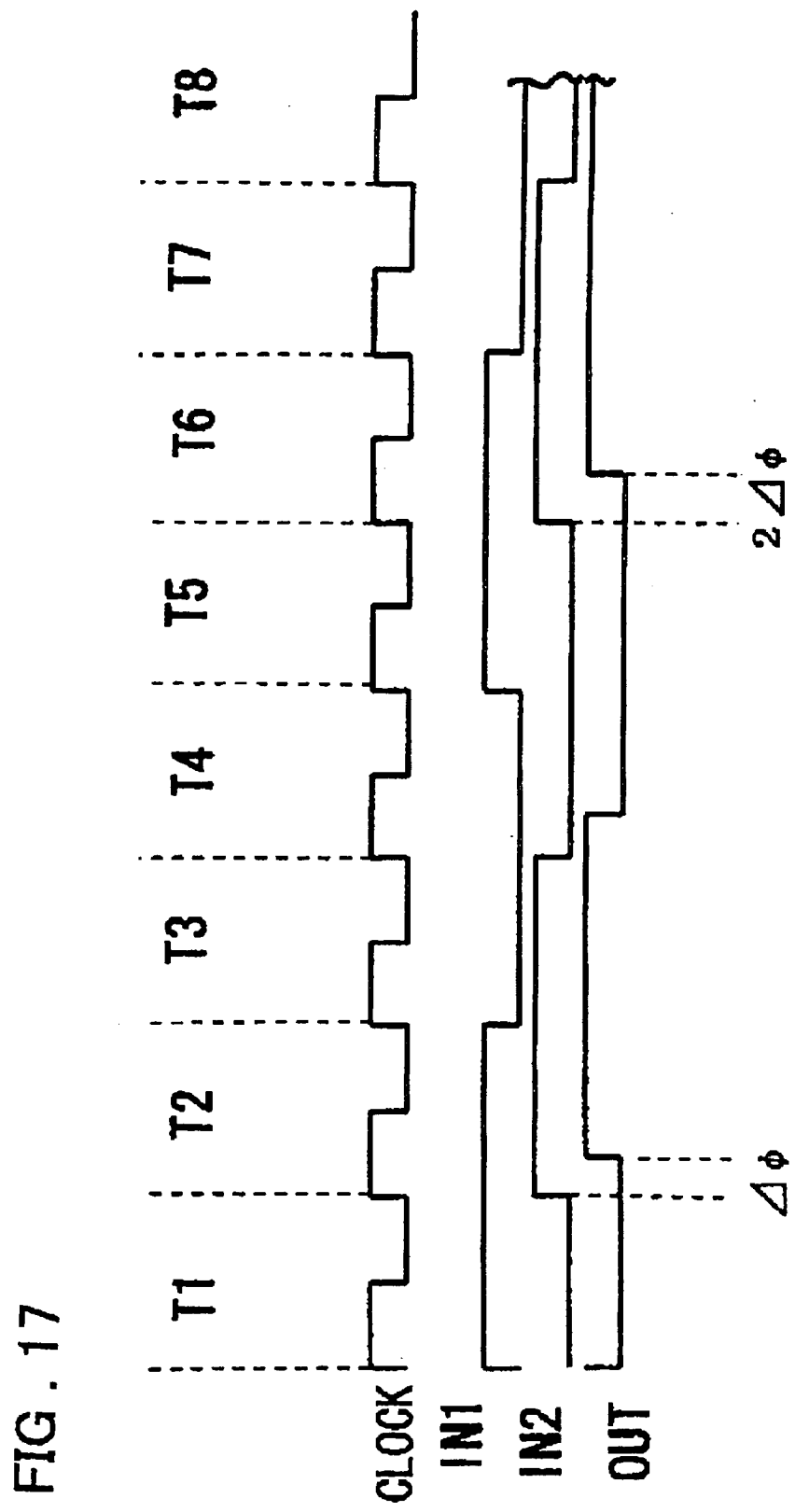
FIG. 17 is a timing chart for illustrating the operation of the fourth embodiment of the present invention.

FIG. 17 illustrates a timing waveform diagram for illustrating an exemplary operation of the circuit shown in FIG. 16. The frequency divider 103 frequency divides the clock. The interpolator 110 is comprised of the circuit shown in FIG. 14. When the input signals INT, IN2 are both at Low level, the internal node of the interpolator 110 is charged. When the input signals IN1, IN2 rise from Low level to High level, the internal node N31 is discharged, such that an output signal OUT, rising at a timing corresponding to division of the timing difference of the input signals IN1, IN2 (clock period tCK) with the internal dividing ratio as set by the control signal PH, is output via an inverter circuit INV3.

Referring to FIG. 17, the signal OUT from the interpolator 110 rises from Low level to High level, with a delay ΔΦas from rising edge of the clock at clock cycle T2.

At clock cycle T4, the input signals IN1, IN2 fed to the interpolator both are at Low level, with the internal node N31 being charged to the power source potential, with the output OUT being at Low level. The value of the control signal PH supplied to the gates of the N-channel MOS transistors MN21 and MN22 is switched, with the signal OUT from the interpolator 10 rising from Low level to High level after delay of time 2 ΔΦ from rising edge of the clocks of the clock cycle T6. In this case, the period of the output clock from the interpolator 110 is 4tCK+ΔΦ.

By varying the setting value of the control signal (selection signal of FIG. 1) supplied to the N-channel MOS transistors MN21 and MN22 of the interpolator 110 (see FIGS. 12 to 15) at preset timing in one clock cycle of the frequency divided clock, the timing of the output clock relative to the edge of the input clock (phase difference) may be changed to convert the frequency.

Figure 18:
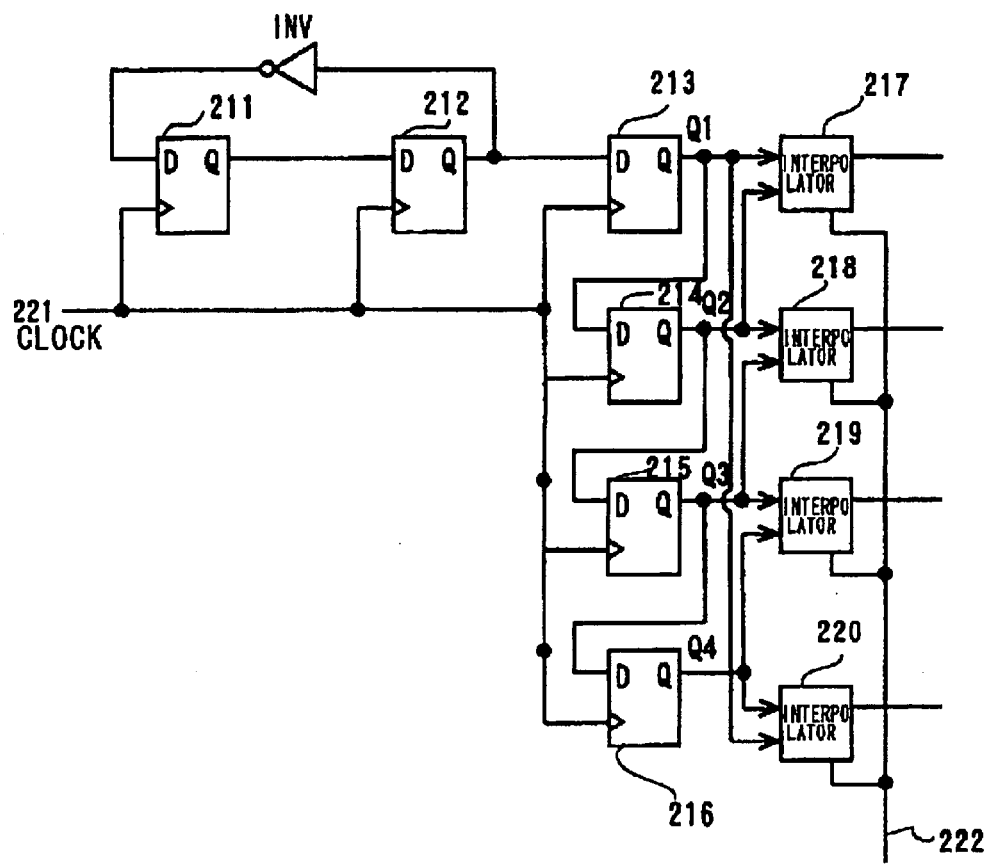
FIG. 18 shows the configuration of a fifth embodiment of the present invention.

Another embodiment of the present invention is hereinafter explained. FIG. 18 illustrates a structure of a fifth embodiment of the present invention in which an interpolator shown in FIGS. 12 to 15 is used in the phase adjustment circuit 101 shown in Fig. 1. Referring to FIG. 18, the present embodiment includes D-flipflops 211, 212, two-stage serial circuits, in which an output of an inverter INV that receives an output signal of the back stage D-flipflops 212 is fed back to a data terminal D of the frond stage D-flipflops 211, and first to fourth D-flipflops 213 to 216, connected in a cascade to form a shift register, fed with an output of the D-flipflop 212 as an input.

The present fifth embodiment also includes a first interpolator 217, fed with outputs Q1, Q2 of the first and second flipflops 213, 214 as inputs and outputting a signal of the time delay corresponding to the division of the timing difference T, a second interpolator 218, fed with outputs Q2, Q3 of the second and third flipflops 214, 215 as inputs and outputting a signal of the time delay corresponding to the division of the timing difference T, a third interpolator 219, fed with outputs Q3, Q4 of the third and fourth flipflops 215, 216 as inputs and outputting a signal of the time delay corresponding to the division of the timing difference T, and a fourth interpolator 219, fed with outputs Q4, Q1 of the fourth and first flipflops 216, 213 as inputs and outputting a signal of the time delay corresponding to the division of the timing difference T. The first to fourth interpolators 217 to 220 are fed with a control signal 222, setting the internal division ratio of the timing difference, from a control circuit, not shown.

The value of the control signal 222 supplied to the first to fourth interpolators 217 to 220 may be fixed without being changed on the clock basis.

Figure 19:
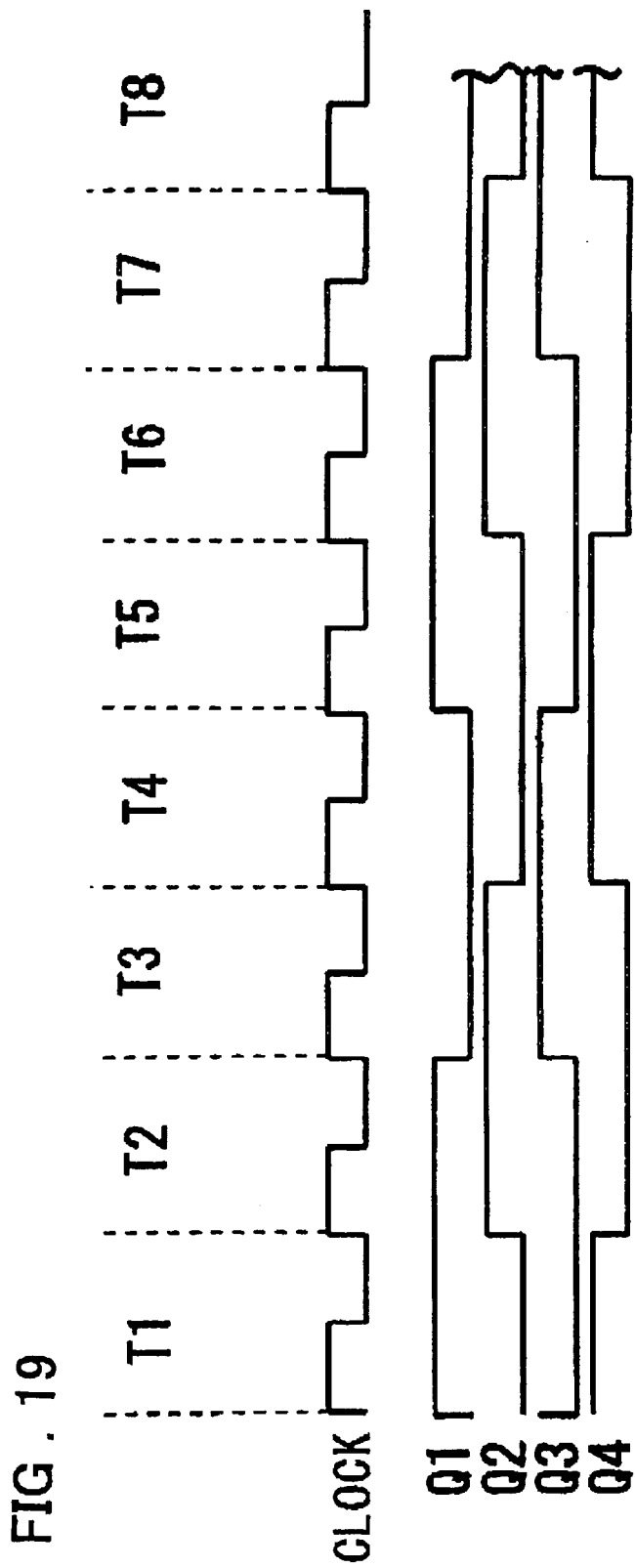
FIG. 19 is a timing chart for illustrating the operation of the fifth embodiment of the present invention.

FIG. 19 illustrates a typical operation of the circuit shown in FIG. 1E. Referring to FIG. 19, the first interpolator 217 outputs an output signal obtained on division of the timing difference tCK of the signals Q1, Q2 (with a timing difference ΔΦ from the rising edge of the clock of the clock cycle T2). The second interpolator 218 outputs an output signal obtained on division of the timing difference tCK of the signals Q2, Q3 (with a timing difference 2 ΔΦ from the rising edge of the clock of the clock cycle T2). The third interpolator 219 outputs an output signal obtained on division of the timing difference tCK of the signals Q3, Q4 (with a timing difference 3 ΔΦ from the rising edge of the clock of the clock cycle T4). The fourth interpolator 220 outputs an output signal obtained on division of the timing difference tCK of the signals Q4, Q1 (with a timing difference 4 ΔΦ from the rising edge of the clock of the clock cycle T2=beginning of the clock period tCK). In this case, the interpolator outputs clocks with a period of tCK(1+¼) for an input clock (clock period tCK).

The first to fourth interpolators 217 to 220 may output the results calculated by a logic circuit depending on the application, or selectively output the result via a selector. The present invention may be applied with advantage to a rate conversion circuit in e.g., mBnB (m bits n bits) coding system.

Figure 20:
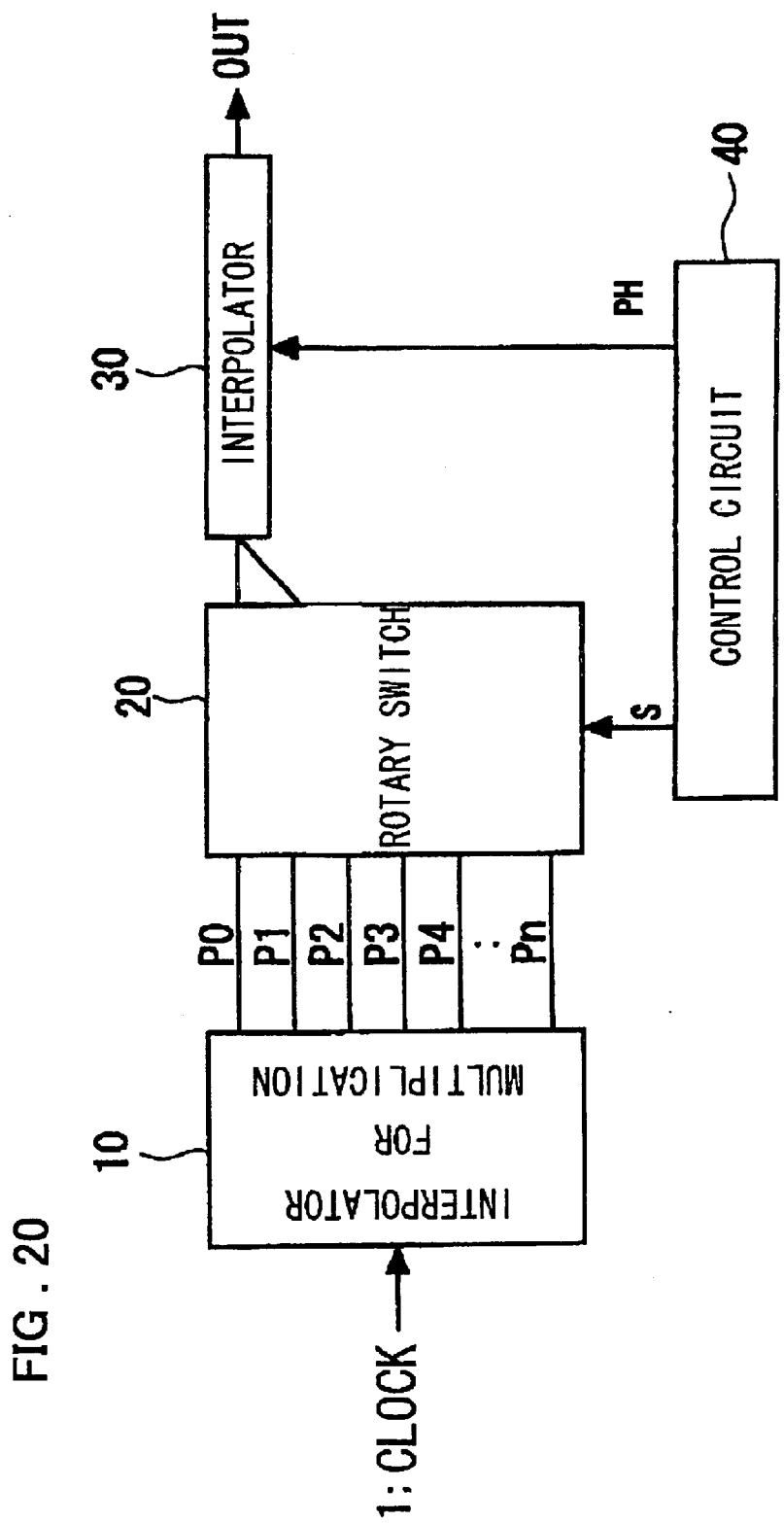
FIG. 20 shows the configuration of a sixth embodiment of the present invention.

A further embodiment of the present invention is hereinafter explained. FIG. 20 illustrates a structure of a sixth embodiment of the present invention. Referring to FIG. 20, the present embodiment includes an interpolator for frequency-multiplication 10, a switch (rotary switch) 20, an interpolator 30, also called a fine adjustment interpolator, and it control circuit 40.

The interpolator for frequency-multiplication 10 generates multiple-phase frequency-multiplication clocks P0 to Pn from the input clock 1. The interpolator for frequency-multiplication 10 is configured as shown in FIG. 5.

The switch 20 selects two of the clocks from the multiple-phase frequency-multiplication clocks P0 to Pn to furnish the selected clocks as two input signals to the fine adjustment interpolator 30.

The control circuit 40 furnishes control signals S for the switch 20 and the fine adjustment interpolator 30 and the PH (control signal furnished to the gates of the N-channel MOS transistors 21, 22 of the interpolator 30). The control circuit 40 includes an adder, not shown, fed with clocks 1, and a decoder, not shown, for decoding an output of the adder to output the control signals D and the PH.

The switch 20 selects odd-phased signal and even-phased signal, neighboring to each other, based on the control signal S from the control circuit 40 to furnish the selected clock pair to the interpolator 30, which then outputs, based on the control signal from the control circuit 40, a signal of the phase corresponding to the internal division of the phase difference (timing difference) of the two inputs. In the present embodiment, the interpolator 30 is configured as shown in FIGS. 12 to 15.

Figure 21:
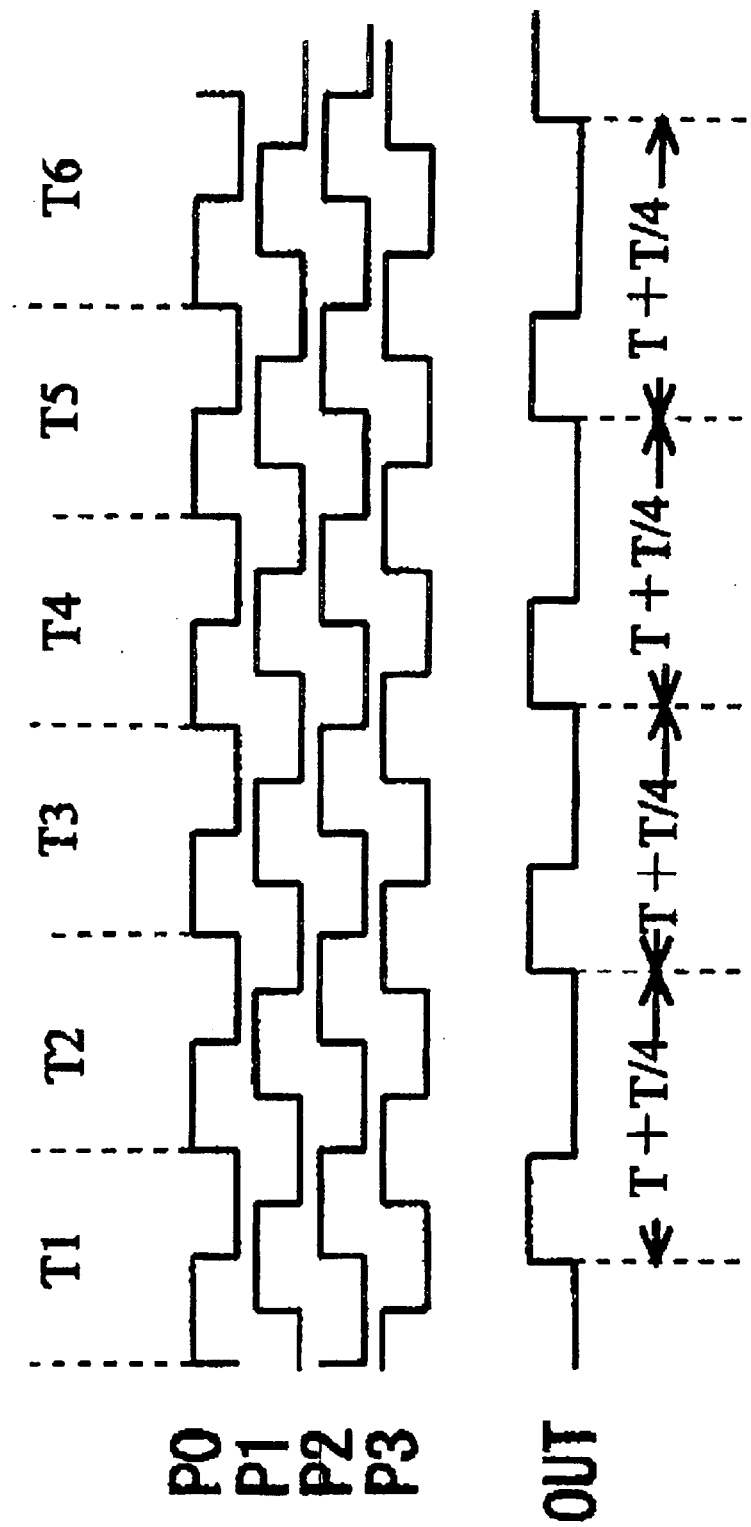
FIG. 21 is a timing chart for illustrating the operation of the sixth embodiment of the present invention.

FIG. 21 Illustrates a typical operation for a case wherein the interpolator 30 is constructed by a circuit shown in FIG. 15 and wherein the interpolator for multiplication 10 (see FIG. 5) generates four-phase multiplication clocks P0 to P3.

The rotary switch 20 cyclically selects multi-phase clocks, front the multi-phase clocks P0 to P3, in the order of, for example, (P0, P1), (P1, P2), (P2, P3), (P3, P0), (P0, P1), . . . . With the period of the multi-phase clocks T, the switch 20 selects P0, P1 at a clock cycle T1, whilst the interpolator 30 is responsive to the rising of P0, P1 to issue an output signal OUT. At a cycle T2, the switch 20 selects P1, P2, while the interpolator 30 is responsive to the rising of P1 and P2 to output an output signal OUT at a timing of time (1+¼) as from the rising edge of the previous output signal OUT. In similar manner, the switch selects P3 and P4, followed by P4, P1, to output clocks with the period T (1+¼).

In the embodiment shown in FIG. 21, the interpolator is outputting clocks with a period (1+¼)T=5T/4 for the period T of the multiplication clocks, with the frequency being ⅘ times that of the clock period. If the interpolator for multiplication 10 is multiplying the input clock by a factor of 2m, the frequency of the output clocks is multiplied by a factor of 8 m/5.

Figure 22:
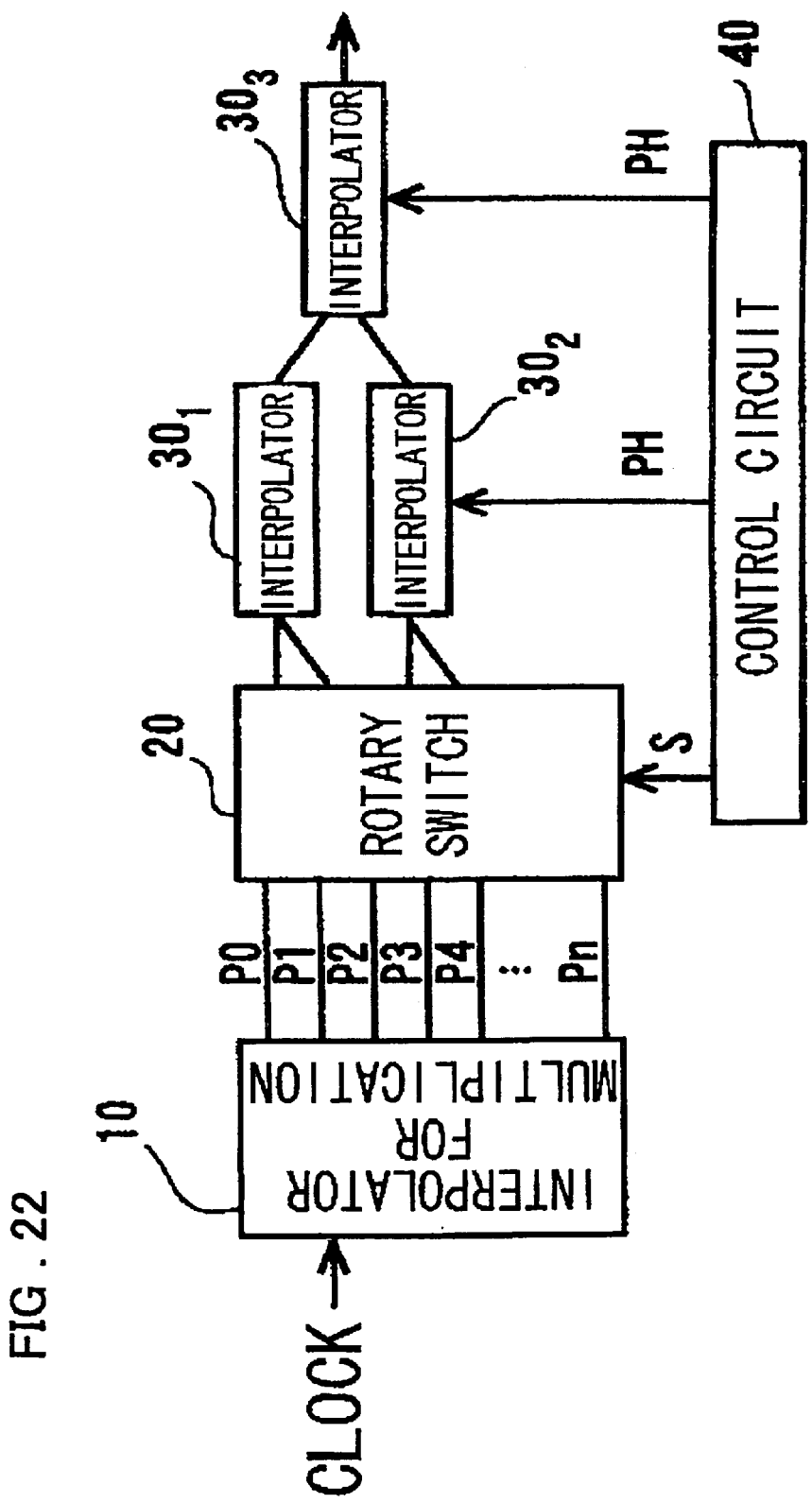
FIG. 22 shows a configuration of a seventh embodiment of the present invention.

A further embodiment of the present invention is hereinafter explained. FIG. 22 shows the structure of a seventh embodiment of the present invention. Referring to FIG. 22, the seventh embodiment of the present invention is a modification of the structure shown in FIG. 20. That is, a rotary switch 20 outputs two sets of paired clocks which are fed to first and second interpolators $30_1$, $30_2$, outputs of which are fed to a third interpolator 110 as inputs. Output clocks are obtained from an output of the third interpolator $10_3$.

In the present embodiment, the ratio of the internal division of the timing difference of the respective interpolators of the first to third interpolators $30_1$ to $30_3$. Alternatively, responsive to the timing accuracy as found by the application, the ratio of internal division of the timing difference of the interpolator $30_1$ may be fixed while that of the interpolators $30_2$, $30_3$ may be varied by the control signals from the control circuit 40. Still alternatively, the ratio of the internal division of the interpolators $30_2$, $30_3$ may be varied depending on the control signal from the control circuit 40. The ratio of the internal division of the timing difference of the interpolators $30_1$, $30_2$ may be fixed, while that of only the last stage interpolator $30_1$ may be varied with the control signal from the control circuit 40.

In a seventh embodiment of the present invention, the fine adjustment interpolators 30 are arranged in a multi-stage configuration, in distinction from the structure shown in FIG. 20, whereby the ratio of the internal division of the timing difference may be set to a finer value. In case the second and third interpolators $30_2$, $30_3$ are arranged as 16 equi-divisional interpolators, the timing difference may be internally divided to a resolution of 1/256.

Figure 23:
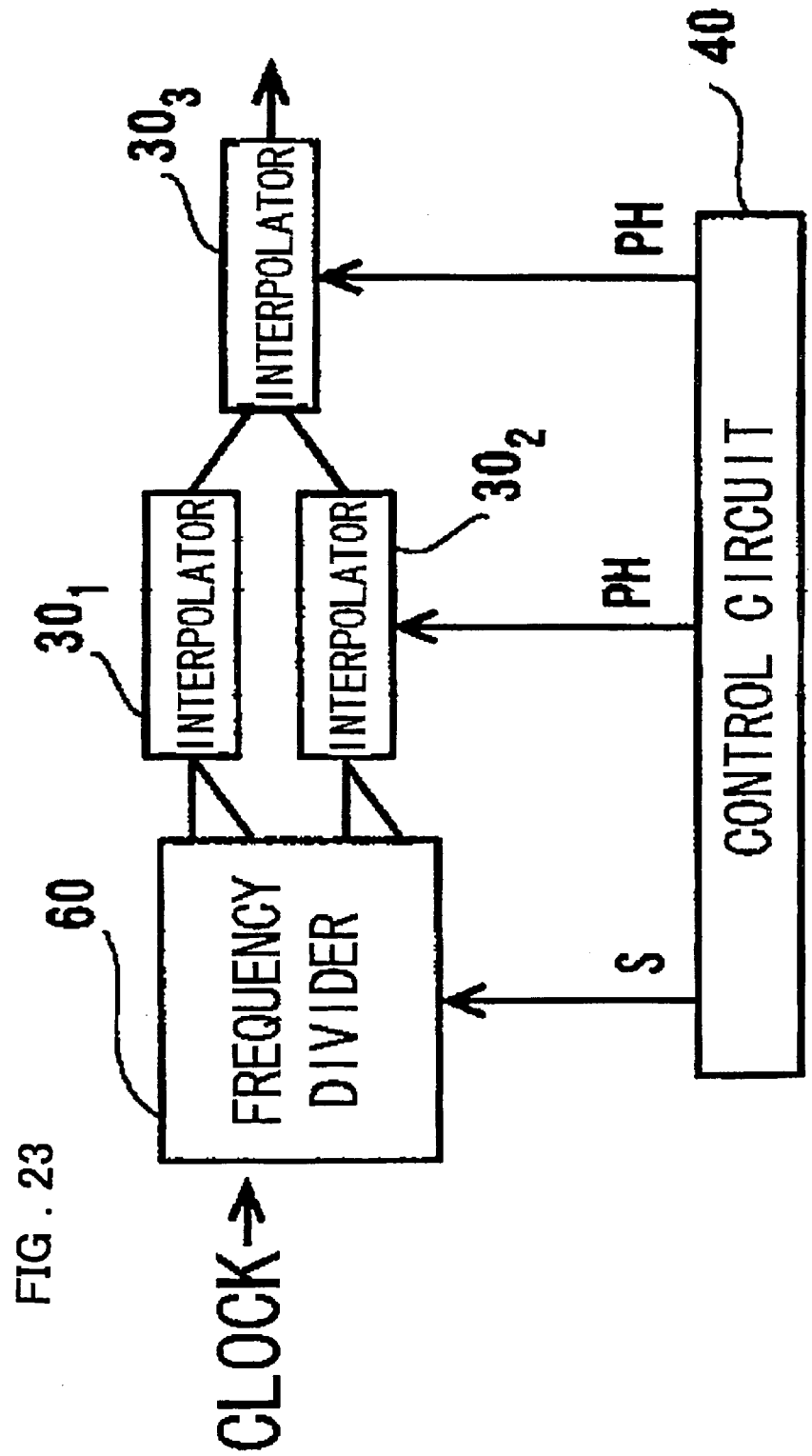
FIG. 23 shows a configuration of an eighth embodiment of the present invention.

An eighth embodiment of the present invention is hereinafter explained. In FIG. 23, showing a modification of the configuration shown in FIG. 3, clocks are frequency divided by a frequency divider 60 to output two paired clocks which are furnished to the first and second interpolators $30_1$, $30_2$. Output clocks are derived from an output of the third interpolator $30_3$, fed as input with the outputs of the two interpolators $30_1$, $30_2$.

Figure 24:
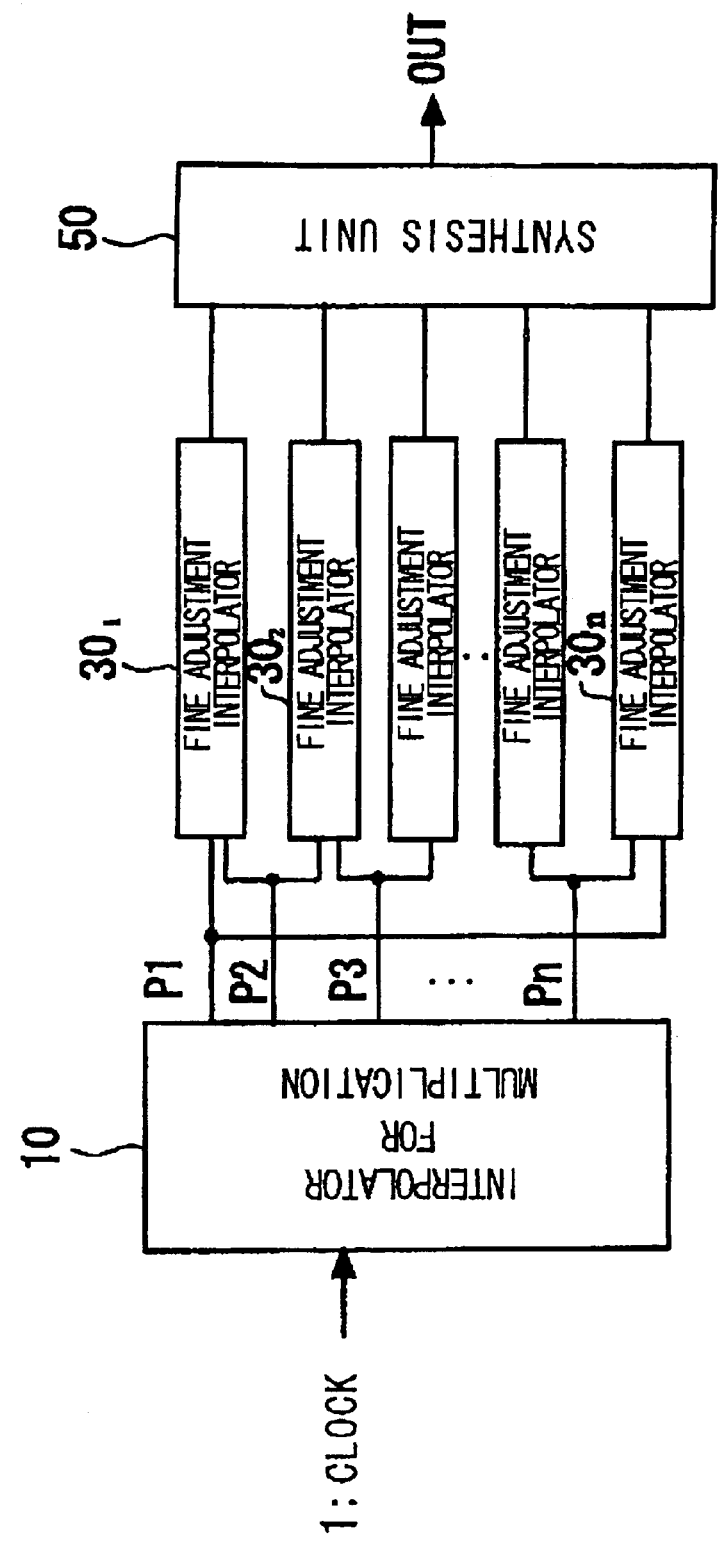
FIG. 24 shows a configuration of a ninth embodiment of the present invention.

A ninth embodiment of the present invention is hereinafter explained. Referring to FIG. 24, the ninth embodiment of the present invention is a modification of the embodiment shown in FIG. 18, and includes an interpolator for frequency-multiplication 10 for generating first to nth clocks P1 to Pn (n-phased multiplication clocks) of respectively different phases, obtained on multiplication of the input clock, first to nth interpolators $30_1$ to $30_n$, and a synthesis unit 50 fed with outputs of the first to nth interpolators $30_1$ to $30_n$ (fine adjustment interpolators) to multiplex the input signals to unify the signals to output a sole output signal OUT. The first to nth interpolators $30_1$ to $30_n$ are fed with two clocks of neighboring phases of the first to nth clocks P1 to Pn from the interpolator for multiplication 10 to output a signal corresponding to division by respectively different ratios of internal division of the timing difference of the two input signals.

The first to nth interpolators $30_1$ to $30_n$ are configured as shown in FIGS. 12 to 15 to divide the timing difference T of the two input signals by m steps, where n≦m. With the interpolator for multiplication 10 and fine adjustment interpolator 30 for generating the n-phased multiplication clocks, it is possible to generate the timing corresponding to division by n×m steps as output signal OUT.

In the embodiment shown in FIG. 24, similarly to the configuration shown in FIG. 18, the interpolator $30_i$ fed with neighboring ith and (i+1)st clocks of the n-phase clocks, as inputs, where i is an integer from 1 to n, with the (n+1)st clock being the first clock P1), and the interpolator $30_{i-1}$ fed with the (i−1)st and Pith clocks as inputs, are set so that the values of the ratio of the internal division of the timing difference thereof will differ from each other. Specifically, the delay time of the interpolator $30_1$ is larger than that of the interpolator $30_{i-1}$.

The synthesis unit 50 for multiplexing outputs of the first to nth interpolators $30_1$ to $30_n$ for outputting an output signal OUT is made up of a pulse width correction circuit 4c and a multiplication circuit 4b.

In the configuration of FIG. 24, the configuration of generating M-phase clocks (M multiplication clocks) from the n-phase multiplication clocks, output from the interpolator for multiplication 10, is explained. In this case, M interpolators are arranged in parallel, where M≦N.

In this case, the ith interpolator $30_i$ is fed with neighboring ith and (i+1)st clocks, where i is an integer from 1 to M and the (n+1)st clock is the first clock P1. The values of the ratio of the internal division prescribing the division positions of the timing difference between the two input signals in the respective interpolators 30 are set as the values are sequentially shifted from the leading end towards the trailing end of the timing domain, each unit step m, in the increasing sequence of the interpolator numbers, such as, for the 1st interpolator $30_1$, the internal division ratio m; M−m, for the 2nd interpolator $30_2$, the internal division ratio 2m; M−2m, for the 3rd interpolator $30_3$, the internal division ratio 3m; M−3m.

Alternatively, the division positions of the timing difference T may be set as the values are sequentially shifted from the trailing end towards the leading end of the timing domain, each unit step m, in the increasing sequence of the interpolator numbers.

This setting may be achieved by controlling the on/off of the N-channel MOS transistors MN21 and MN22, with the control signal PH supplied to the interpolator, as explained with reference to FIGS. 12 to 15. In the present embodiment, the value of the ratio of the internal division of each interpolator is fixed.

From the synthesis unit 50, multiplexing the outputs of the m interpolators 30 to a sole output signal OUT, M-tupled clocks may be produced. For example, with m=1 for n=8 and M=7, seven-phased clocks may be generated from the eight-phase clocks (eight-phased clocks) output from the interpolator for multiplication 10. From the synthesis unit 50, fed with the seven-phased clocks, 7-tupled(multiplied by 7 in frequency) clock is output.

Figure 25:
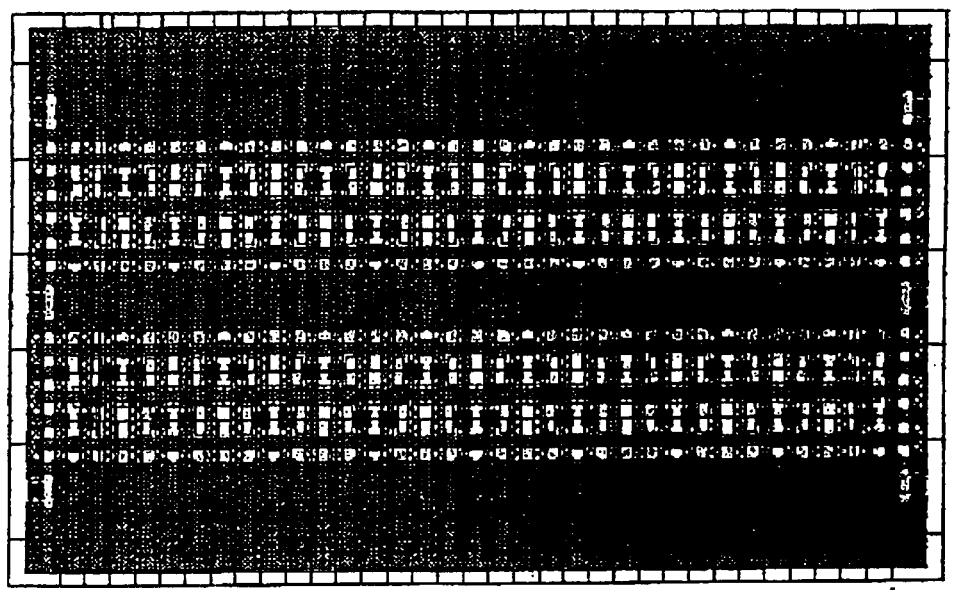
FIG. 25 shows a layout of a 16-equi-division interpolator used in the embodiments of the present invention.

FIG. 25 illustrates an example of a layout of an integrated circuit of a 16-equi-division interpolator.

Figure 26:
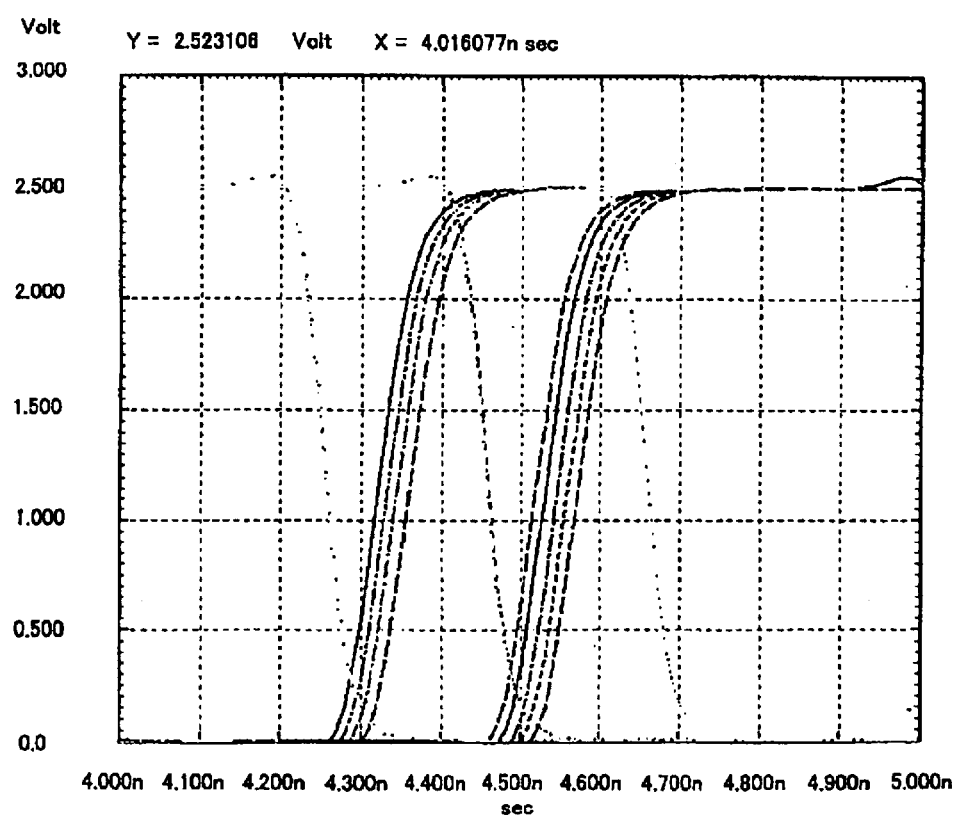
FIG. 26 is a waveform diagram showing the results of simulation of the output of the phase adjustment circuit employing the q6-equi-division interpolator in the embodiments of the present invention.
Figure 27:
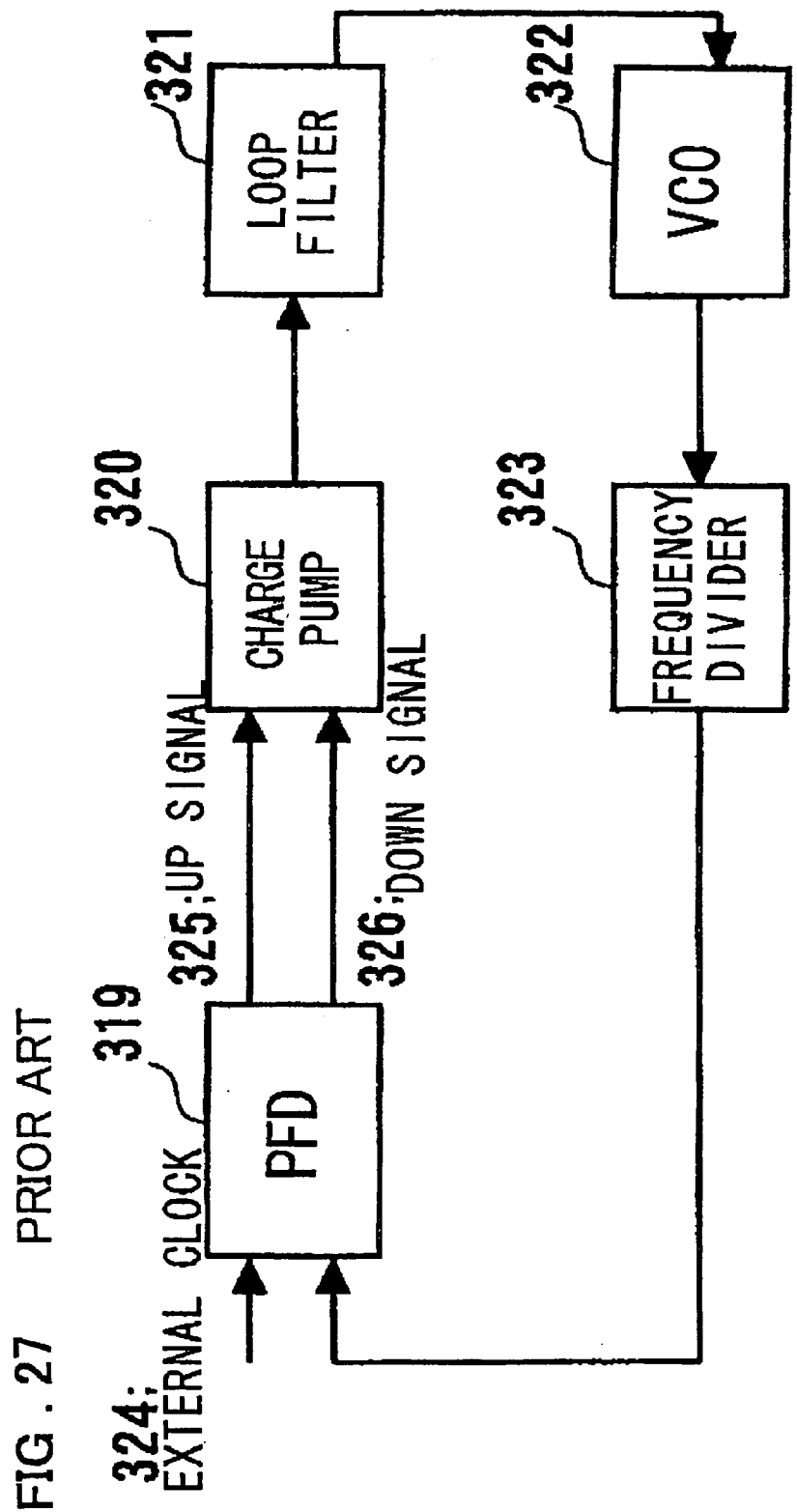
FIG. 27 shows a typical conventional clock control circuit.

FIG. 26 shows waveforms obtained by a circuit simulation of a phase adjustment circuit employing a fine adjustment interpolator. Phase difference of 625 MHZ is divided into 16 equal portions by a 16-equal-dividing interpolator and five phases of the phase changeover portion are shown. The fine adjustment phase difference is 12.5 ps.

In the above-described embodiment of the present invention, ill which the interpolators are arrayed in plural stages, the timing edge of an output signal can be controlled to an order of 10 psec. That is, the present invention is applicable not only to a clock frequency conversion circuit or a clock synchronization circuit but also to a pattern generator or a timing generator in a measurement and testing device. For example, the present invention may be used with advantage in a timing generator for an LSI tester in which the timing is variably set on-the-fly.

The configuration having a frequency divider and a phase adjustment circuit (interpolator for phase adjustment) as explained with reference to FIGS. 3 and 23, for example, may be applied to a frequency divider in a PLL (phase locked loop) having a charge pump for generating the voltage corresponding to the phase difference of the phase comparator, a loop filter, a VCO (voltage-controlled oscillator) fed with an output of the loop filter as a control voltage and a frequency dividing circuit for supplying a signal obtained on frequency division of the VCO output to the phase comparator.

The meritorious effects of the present invention are summarized as follows. According to the present invention, as described above, non-integer frequency conversion may be achieved to high precision despite a simpler structure.

The reason is that such a configuration is used in the present invention in which the phases of the signals output from the phase adjustment circuit fed with clocks as inputs may be summed or subtracted by unit phase difference on the clock basis.

According to the present invention, there is provided on feedback system, not jitter proper to the feedback system, thus enabling high-speed clock synchronization. It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A clock control circuit comprising:

an interpolator receiving a frequency divided signal produced by a frequency dividing circuit receiving a clock signal and a signal obtained by shifting the frequency divided signal in a preset number of periods of the clock signal to produce a signal obtained on division of a timing difference of said two input signals at a preset ratio of internal division; and a control circuit for varying value of the ratio of the internal division of the timing difference in said interpolator based on said clock signal.

* * * * *